United States Patent
Park et al.

(10) Patent No.: US 11,609,609 B2
(45) Date of Patent: Mar. 21, 2023

(54) PRESSURE SENSOR AND DISPLAY DEVICE INCLUDING THE SAME

(71) Applicant: Samsung Display Co., Ltd., Yongin-si (KR)

(72) Inventors: So Hee Park, Cheonan-si (KR); Won Ki Hong, Suwon-si (KR); Hee Seomoon, Hwaseong-si (KR); Hyeon Jun Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 274 days.

(21) Appl. No.: 16/851,740

(22) Filed: Apr. 17, 2020

(65) Prior Publication Data

US 2021/0102823 A1 Apr. 8, 2021

(30) Foreign Application Priority Data

Oct. 8, 2019 (KR) .......................... 10-2019-0124462

(51) Int. Cl.
  *G06F 1/16* (2006.01)
  *G06F 3/044* (2006.01)
  *G01D 5/241* (2006.01)

(52) U.S. Cl.
  CPC ........... *G06F 1/1637* (2013.01); *G01D 5/241* (2013.01); *G06F 3/044* (2013.01)

(58) Field of Classification Search
  CPC ....... G01D 5/241; G06F 3/044; G06F 1/1626; G06F 1/3262; G06F 3/0446; G06F 3/0416; G06F 3/0447; G06F 3/0445; G06F 3/0412; G06F 3/04164; G01L 1/08; G01L 1/14; G01L 1/142; G01L 1/144; G01L 1/16; G01L 1/18; G01L 1/20; G01L 1/23
  See application file for complete search history.

(56) References Cited

U.S. PATENT DOCUMENTS

| | | | |
|---|---|---|---|
| 7,538,760 B2 | 5/2009 | Hotelling et al. | |
| 8,654,524 B2 | 2/2014 | Pance et al. | |
| 8,686,952 B2 | 4/2014 | Burrough et al. | |
| 8,787,006 B2 | 7/2014 | Golko et al. | |
| 2009/0194344 A1* | 8/2009 | Harley | G06F 3/0446 |
| | | | 178/18.06 |

(Continued)

FOREIGN PATENT DOCUMENTS

| KR | 10-2018-0113081 A | 10/2018 |
|---|---|---|
| KR | 10-2019-0070381 A | 6/2019 |

OTHER PUBLICATIONS

Anodized Aluminum Oxide-Assisted Low-Cost Flexible Capacitive Pressure Sensors Based on Double-Sided Nanopillars by a Facile Fabrication Method, Yunjian Guo et al. ACS Appl. Mater. Interfaces 2019 ,48594-48603 (Year: 2019).*

*Primary Examiner* — Nasima Monsur
*Assistant Examiner* — Dilara Sultana
(74) *Attorney, Agent, or Firm* — Lewis Roca Rothgerber Christie LLP

(57) ABSTRACT

A pressure sensor, includes: a first substrate; a pressure sensing layer on one surface of the first substrate; and a driving electrode and a sensing electrode on the pressure sensing layer and spaced apart from each other, wherein the driving electrode and the sensing electrode are on a same layer, and each of the driving electrode and the sensing electrode is directly on the pressure sensing layer.

11 Claims, 24 Drawing Sheets

(56) References Cited

U.S. PATENT DOCUMENTS

| | | |
|---|---|---|
| 2014/0028575 A1 | 1/2014 | Parivar et al. |
| 2014/0085213 A1 | 3/2014 | Huppi et al. |
| 2014/0091857 A1 | 4/2014 | Bernstein |
| 2014/0092064 A1 | 4/2014 | Bernstein et al. |
| 2014/0293145 A1 | 10/2014 | Jones et al. |
| 2015/0061049 A1 | 3/2015 | Weber |
| 2015/0276531 A1* | 10/2015 | Matsuhiro ............. G01L 9/0072 73/718 |
| 2017/0220162 A1* | 8/2017 | Ko ........................ G06F 3/0443 |

* cited by examiner

FIG. 6
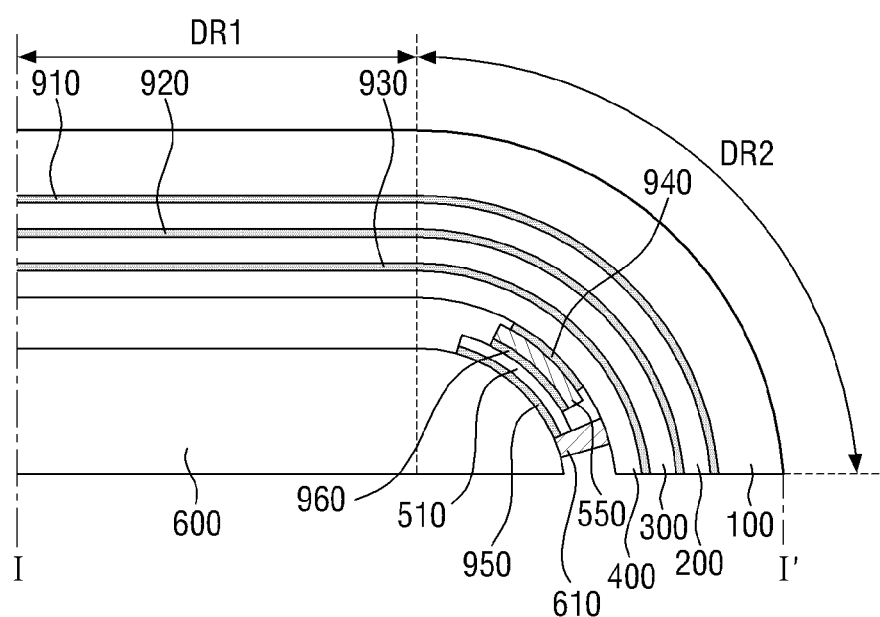
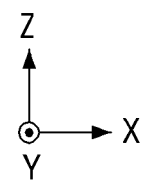

FIG. 8
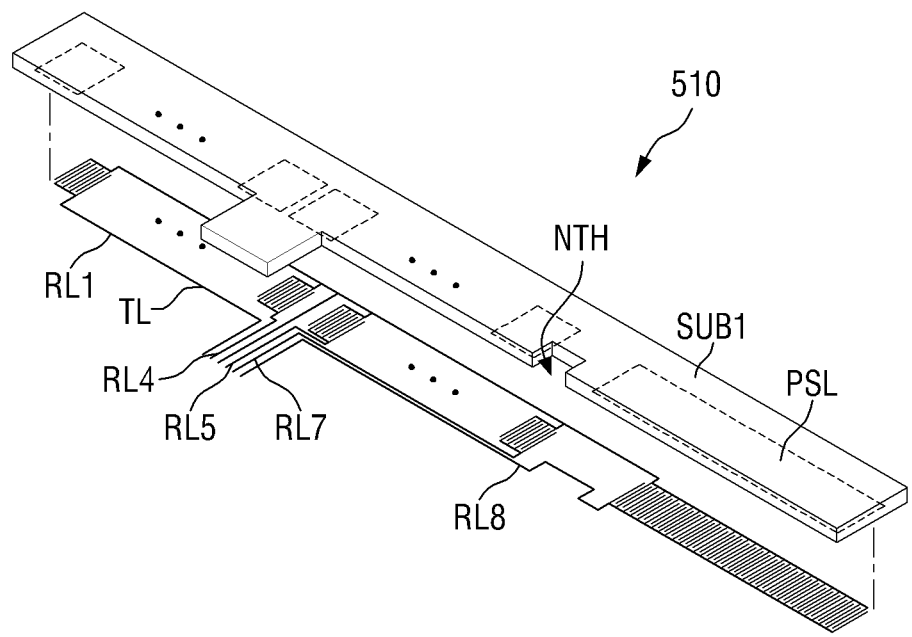
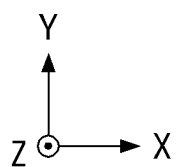

PRESSURE SENSOR AND DISPLAY DEVICE INCLUDING THE SAME

The present application claims priority to and the benefit of Korean Patent Application No. 10-2019-0124462 filed on Oct. 8, 2019 in the Korean Intellectual Property Office, the disclosure of which is incorporated herein by reference in its entirety.

BACKGROUND

1. Field

Aspects of some example embodiments of the present invention relate to a pressure sensor and a display device including the same.

2. Description of the Related Art

A display device for displaying an image may be used for various electronic appliances for displaying images to a user, such as smart phones, tablet PCs, digital cameras, notebook computers, navigators, and televisions. Display devices generally include a display panel for generating and displaying images and various input devices.

In the fields of smart phones and tablet PCs, a touch panel for recognizing or sensing a touch input may be utilized with a display device. The touch panel may be utilized in lieu of a physical input device such as a keypad because of the convenience of touching. Research has been conducted to implement various inputs by mounting a pressure sensor in addition to the touch panel on a display device.

The above information disclosed in this Background section is only for enhancement of understanding of the background and therefore the information discussed in this Background section does not necessarily constitute prior art.

SUMMARY

Aspects of some example embodiments of the invention include a pressure sensor in which has a relatively reduced thickness.

According to some example embodiments of the invention, a display device includes a pressure sensor having a relatively reduced thickness.

According to some example embodiments, a pressure sensor includes a first substrate; a pressure sensing layer on one surface of the first substrate; and a driving electrode and a sensing electrode on the pressure sensing layer and spaced apart from each other, wherein the driving electrode and the sensing electrode are on the same layer, and each of the driving electrode and the sensing electrode is directly on the pressure sensing layer.

According to some example embodiments, the pressure sensing layer may include a first portion on one surface of the first substrate, and a plurality of second portions protruding from the first portion toward the sensing electrode and the driving electrode.

According to some example embodiments, the plurality of second portions may be in direct contact with the driving electrode and the sensing electrode.

According to some example embodiments, the first portion may be spaced apart from the driving electrode and the sensing electrode with a space therebetween.

According to some example embodiments, a first contact area between the second portion and the driving electrode and between the second portion and the sensing electrode before pressure is applied to the pressure sensor may be smaller than a second contact area between the second portion and the driving electrode and between the second portion and the sensing electrode after pressure is applied to the pressure sensor.

According to some example embodiments, the cross-section of the second portion may have a semi-circular shape, a semi-elliptic shape, a triangular shape, a trapezoidal shape, or a rectangular shape.

According to some example embodiments, the pressure sensing layer may include a first portion on one surface of the first substrate, and a plurality of second portions indented from the first portion toward the first substrate.

According to some example embodiments, the plurality of second portions may overlap the driving electrode and the sensing electrode in a thickness direction, and may not overlap a space between the driving electrode and the sensing electrode.

According to some example embodiments, the driving electrode may include a first driving electrode portion, and a second driving electrode protruding from the first driving electrode portion to the pressure sensing layer; and the sensing electrode may include a first sensing electrode portion, and a second sensing electrode protruding from the first sensing electrode portion to the pressure sensing layer.

According to some example embodiments, the second driving electrode portion may be in direct contact with the pressure sensing layer, and the second sensing electrode portion may be in direct contact with the pressure sensing layer.

According to some example embodiments, each of the driving electrode and the sensing electrode may include an indentation pattern indented in a direction opposite to the pressure sensing layer.

According to some example embodiments, a pressure sensor includes a first substrate; a second substrate facing the first substrate; a pressure sensing layer on one surface of the first substrate facing the second substrate; and a driving electrode and a sensing electrode on one surface of the second substrate facing the first substrate and spaced apart from each other, wherein the driving electrode and the sensing electrode are on the same layer, and the pressure sensing layer includes an uneven structure on a surface facing the driving electrode and the sensing electrode.

According to some example embodiments, a display device includes a display panel; and a pressure sensor under the display panel, wherein the pressure sensor includes: a first substrate; a pressure sensing layer on one surface of the first substrate; and a driving electrode and a sensing electrode on the pressure sensing layer and spaced apart from each other, wherein the driving electrode and the sensing electrode are on the same layer, and each of the driving electrode and the sensing electrode is directly on the pressure sensing layer.

According to some example embodiments, the pressure sensing layer may include a first portion on one surface of the first substrate, and a plurality of second portions protruding from the first portion toward the sensing electrode and the driving electrode.

According to some example embodiments, the pressure sensing layer may include a first portion on one surface of the first substrate, and a plurality of second portions indented from the first portion toward the first substrate.

According to some example embodiments, the plurality of second portions may overlap the driving electrode and the sensing electrode in a thickness direction, and may not overlap a space between the driving electrode and the sensing electrode.

According to some example embodiments, the driving electrode may include a first driving electrode portion, and a second driving electrode portion protruding from the first driving electrode portion toward the pressure sensing layer; the sensing electrode may include a first sensing electrode portion, and a second sensing electrode portion protruding from the first sensing electrode portion toward the pressure sensing layer; and the second driving electrode portion may be in direct contact with the pressure sensing layer, and the second sensing electrode portion may be in direct contact with the pressure sensing layer.

According to some example embodiments, each of the driving electrode and the sensing electrode may include an indentation pattern indented in a direction opposite to the pressure sensing layer.

According to some example embodiments, each of the driving electrode and the sensing electrode may extend along a first direction, and a plurality of the driving electrodes and a plurality of the sensing electrodes may be provided; and the plurality of the driving electrodes and the plurality of the sensing electrodes may be alternately arranged along a second direction crossing the first direction in a plan view, and each of the one driving electrode and the one sensing electrode may include a plurality of patterns.

However, aspects of the present invention are not restricted to the one set forth herein. The above and other aspects of embodiments according to the present invention will become more apparent to one of ordinary skill in the art to which the present invention pertains by referencing the detailed description of the present invention given below.

BRIEF DESCRIPTION OF THE DRAWINGS

The above and other aspects and features of embodiments according to the present invention will become more apparent by describing in more detail example embodiments thereof with reference to the attached drawings, in which:

FIG. 6 is a cross-sectional view taken along the line I-I' of FIG. 3;

FIG. 8 is a perspective view of a pressure sensor according to some example embodiments;

DETAILED DESCRIPTION

Figure 1:
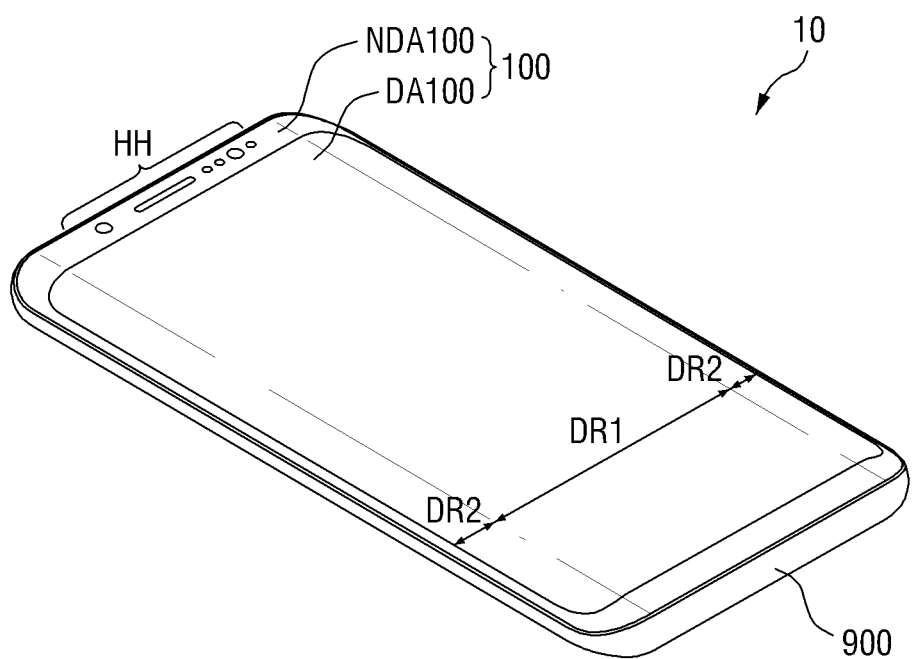
FIG. 1 is a perspective view of a display device according to some example embodiments.

Specific structural and functional descriptions of example embodiments of the invention disclosed herein are only for illustrative purposes of the embodiments of the invention. The invention may be embodied in many different forms without departing from the spirit and scope of the invention. Therefore, the example embodiments of the invention are disclosed only for illustrative purposes and should not be construed as limiting the invention. That is, the invention is only defined by the scope of the claims and their equivalents.

It will be understood that when an element is referred to as being related to another element such as being "coupled" or "connected" to another element, it can be directly coupled or connected to the other element or intervening elements may be present therebetween. In contrast, it should be understood that when an element is referred to as being related to another element such as being "directly coupled" or "directly connected" to another element, there are no intervening elements present. Other expressions that explain the relationship between elements, such as "between," "directly between," "adjacent to," or "directly adjacent to," should be construed in the same way.

Throughout the specification, the same reference numerals will refer to the same or like parts.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The example term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The example terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Aspects of some example embodiments are described herein with reference to cross section illustrations that are schematic illustrations of some example embodiments. As such, variations from the shapes of the illustrations as a result, for example, of manufacturing techniques and/or tolerances, are to be expected. Thus, the example embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the attached drawings.

Figure 2:
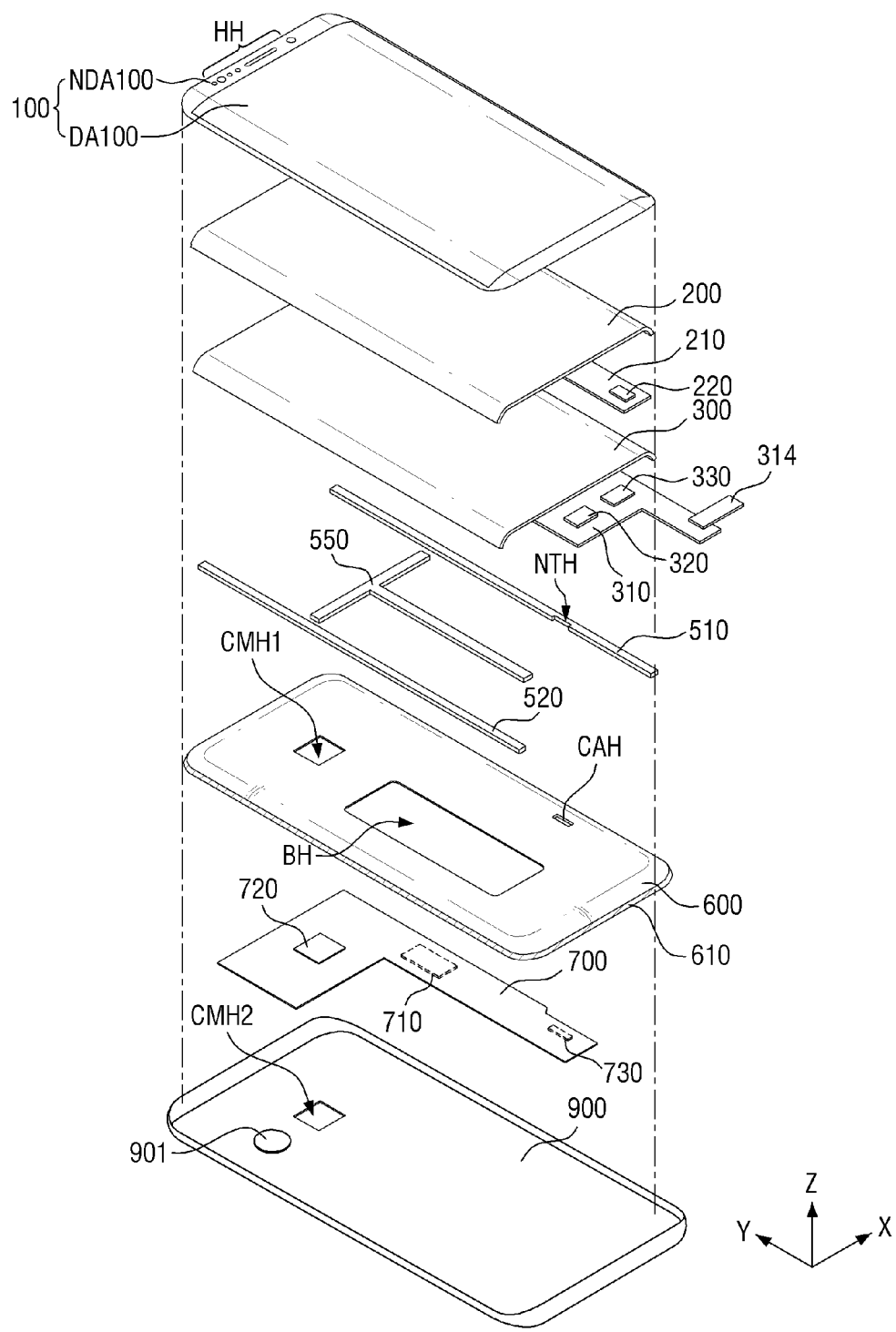
FIG. 2 is an exploded perspective view of a display device according to some example embodiments.

FIG. 1 is a perspective view of a display device according to some example embodiments, and FIG. 2 is an exploded perspective view of a display device according to some example embodiments.

Referring to FIGS. 1 and 2, a display device 10 according to some example embodiments includes a cover window 100, a touch sensing unit 200, a touch circuit board 210, a touch driver 220, a display panel 300, a display circuit board 310, a display driver 320, a pressure sensing unit 330, a first pressure sensor 510, a second pressure sensor 520, a pressure sensing circuit board 550, a lower frame 600, a main circuit board 700, and a lower cover 900.

In this specification, the "on", "over", "top", "upper side", or "upper surface" refers to a direction in which the cover window 100 is located, that is, a Z-axis direction, with respect to the display panel 300, and the "beneath", "under", "bottom", "lower side", or "lower surface" refers to a direction in which the lower frame 600 is located, that is, a direction opposite to the Z-axis direction, with respect to the display panel 300. Further, the "left", "right", "upper", and "lower" refer to directions when the display panel 300 is viewed from the plane. For example, the "left" refers to a direction opposite to the X-axis direction, the "right" refers to the X-axis direction, the "upper" refers to the Y-axis direction, and the "lower" refers to a direction opposite to the Y-axis direction.

The display device 10 may have a rectangular shape in a plan view. For example, as shown in FIGS. 1 and 2, the display device 10 may have a rectangular planar shape having short sides in the first direction (X-axis direction) and long sides in the second direction (Y-axis direction). The edge where the short side in the first direction (X-axis direction) meets the long side in the second direction (Y-axis direction) may be formed to have a round shape of a curvature (e.g., a set or predetermined curvature) or have a right angle shape. The planar shape of the display device 10 is not limited to a rectangular shape, and may be formed in any other suitable shape (e.g., another polygonal shape, a circular shape, or an elliptical shape).

The display device 10 may include a first region DR1 formed flat and second regions DR2 extending from the left and right sides of the first region DR1. The second regions DR2 may be formed to be flat or curved. When the second regions DR2 are formed to be flat, the angle formed by the first region DR1 and each of the second regions DR2 may be an obtuse angle. When the second regions DR2 are formed to be curved, the second regions DR2 may have constant curvatures or variable curvatures.

Although it is shown in FIG. 1 that the second regions DR2 extend from the left and right sides of the first region DR1, respectively, embodiments according to the present invention are not limited thereto. That is, the second regions DR2 may extend from only one of the left and right sides of the first region DR1. Alternatively, the second regions DR2 may extend from at least one of the upper or lower sides as well as left or right sides of the first region DR1. Hereinafter, a case where the second region DR2 is located at the left and right edges of the display device 10 will be mainly described.

The cover window 100 may be located on the display panel 300 so as to cover the upper surface of the display panel 300. Thus, the cover window 100 may function to protect the upper surface of the display panel 300. The cover window 100 may be attached to the touch sensing unit 200 through a first adhesive member 910 as shown in FIG. 6. The first adhesive member 910 may be an optically clear adhesive (OCA) film or an optically clear resin (OCR) film.

The cover window 100 may include a light transmitting area DA100 corresponding to the display panel 300 and a light blocking area NDA100 corresponding to an area other than the display panel 300. The cover window 100 may be located in the first region DR1 and the second regions DR2. The light transmitting area DA100 may be located in a part of the first region DR1 and parts of the second regions DR2. The light blocking area NDA100 may be formed to be opaque. Or, the light blocking area NDA100 may be formed as a decorative layer having a pattern that can be seen to a user when an image is not displayed. For example, a company logo or various characters may be patterned on the light blocking area NDA100. Further, the light blocking area NDA100 may be provided with a plurality of holes HH for exposing a front camera, a front speaker, an infrared sensor, an iris recognition sensor, an ultrasonic sensor, an illuminance sensor, or the like, but embodiments according to the present invention are not limited thereto. For example, some or all of a front camera, a front speaker, an infrared sensor, an iris recognition sensor, an ultrasonic sensor, and an illuminance sensor may be mounted in the display panel 300. In this case, some or all of the plurality of holes HH may be omitted.

The cover window 100 may be made of glass, sapphire, and/or plastic. The cover window 100 may be rigid or flexible.

The touch sensing unit 200 may be located between the cover window 100 and the display panel 300. The touch sensing unit 200 may be located in the first region DR1 and the second regions DR2. Thus, the touch sensing unit 200 may sense a user's touch in the second regions DR2 as well as the first region DR1.

The touch sensing unit 200 may be attached to the lower surface of the cover window 100 through the first adhesive member 910 as shown in FIG. 6. The touch sensing unit 200 may be additionally provided thereon with a polarizing film in order to prevent the deterioration of visibility due to the reflection of external light. In this case, the polarizing film may be attached to the lower surface of the cover window 100 through the first adhesive member 910.

The touch sensing unit 200 is a unit for sensing a touch position of a user (or an external object), and may be implemented as a capacitive type such as a self-capacitance type or a mutual capacitance type. When touch sensing unit 200 is implemented as a self-capacitive type, the touch sensing unit 200 may include only the touch driving electrodes, but when the touch sensing unit 200 is implemented as a mutual capacitance type, the touch sensing unit 200 may include both the touch driving electrodes and the touch sensing electrodes. Hereinafter, the touch sensing unit 200 will be described, assuming that the touch sensing unit 200 is implemented as a mutual capacitance type.

The touch sensing unit 200 may be a panel type or a film type. In this case, the touch sensing unit 200 may be attached onto a thin encapsulation film of the display panel 300 through a second adhesive member 920 as shown in FIG. 6. The second adhesive member 920 may be an optically clear adhesive (OCA) film or an optically clear resin (OCR) film.

The touch sensing unit 200 may be formed integrally with the display panel 300. In this case, the touch driving electrodes and touch sensing electrodes of the touch sensing unit 200 may be located on the thin encapsulation film of the display panel 300.

Figure 3:
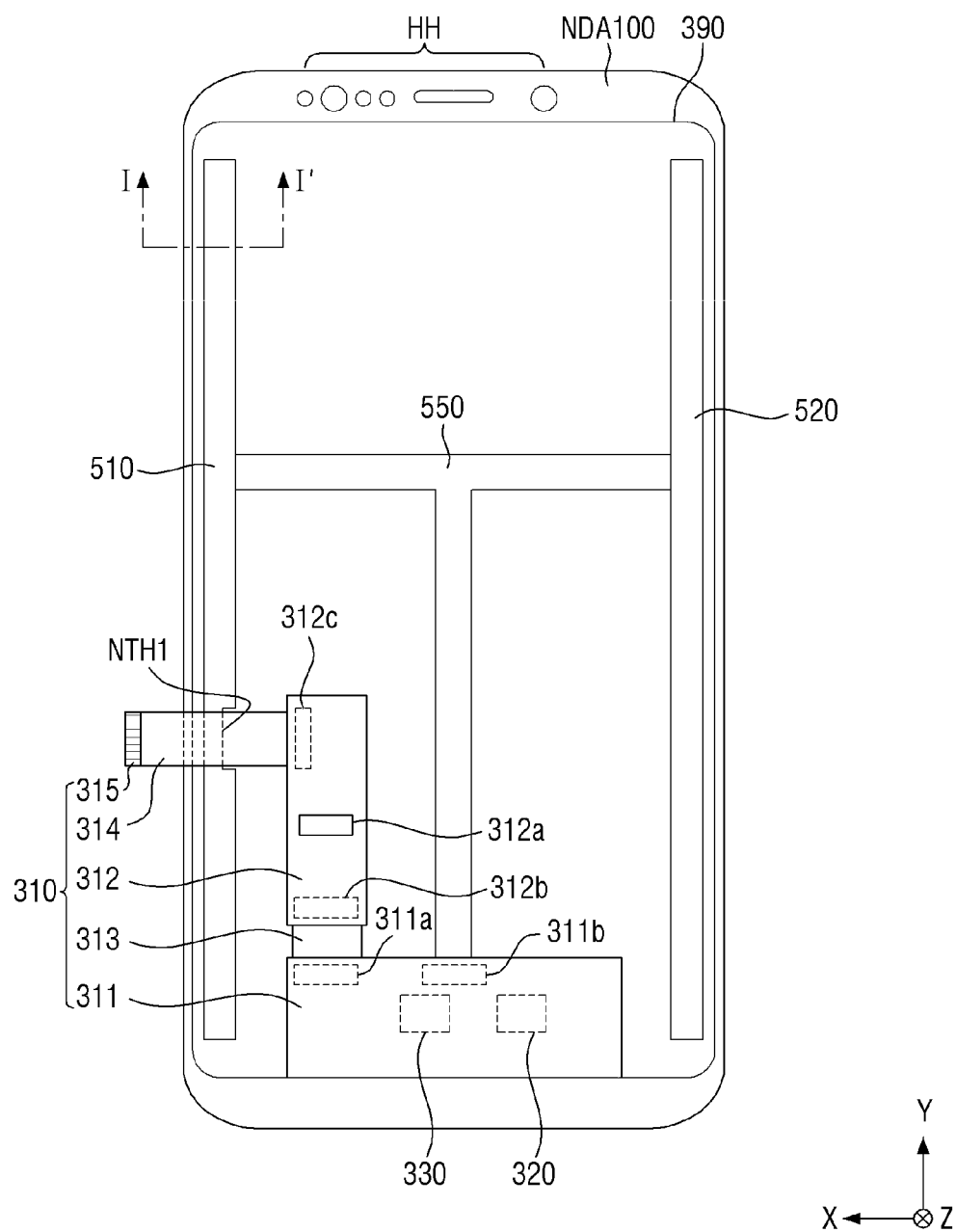
FIG. 3 is a bottom view showing an example of a display panel attached to the cover window FIG. 2.

The touch circuit board 210 may be attached to one side of the touch sensing unit 200. For example, the touch circuit board 210 may be attached onto pads provided on one side of the touch sensing unit 200 using an anisotropic conductive film. Further, the touch circuit board 210 may be provided with a touch connection portion, and the touch connection portion may be connected to a touch connector 312a of the display circuit board 310 as shown in FIG. 3. The touch circuit board 210 may be a flexible printed circuit board.

The touch driver 220 may apply touch driving signals to the touch driving electrodes of the touch sensing unit 200, sense sensing signals from the touch sensing electrodes of the touch sensing unit 200, and analyze the sensing signals to calculate a touch position of the user (e.g., a user's finger, or an external object, such as a stylus). The touch driver 220 may be formed as an integrated circuit and mounted on the touch circuit board 210.

The display panel 300 may be arranged under the touch sensing unit 200. The display panel 300 may be arranged to overlap the light transmitting area 100DA of the touch sensing unit 200. The display panel 300 may be located in the first region DR1 and the second regions DR2. Thus, the image of the display panel 300 may be seen not only in the first region DR1 but also in the second regions DR2.

The display panel 300 may be a light emitting display panel including a light emitting element. Examples of the display panel 300 may include an organic light emitting display panel using an organic light emitting diode, an ultra-small light emitting diode display panel using a micro LED, or a quantum dot light emitting diode display panel using a quantum dot light emitting diode. Hereinafter, the display panel 300 will be mainly described as an organic light emitting display panel as shown in FIG. 7.

Figure 7:
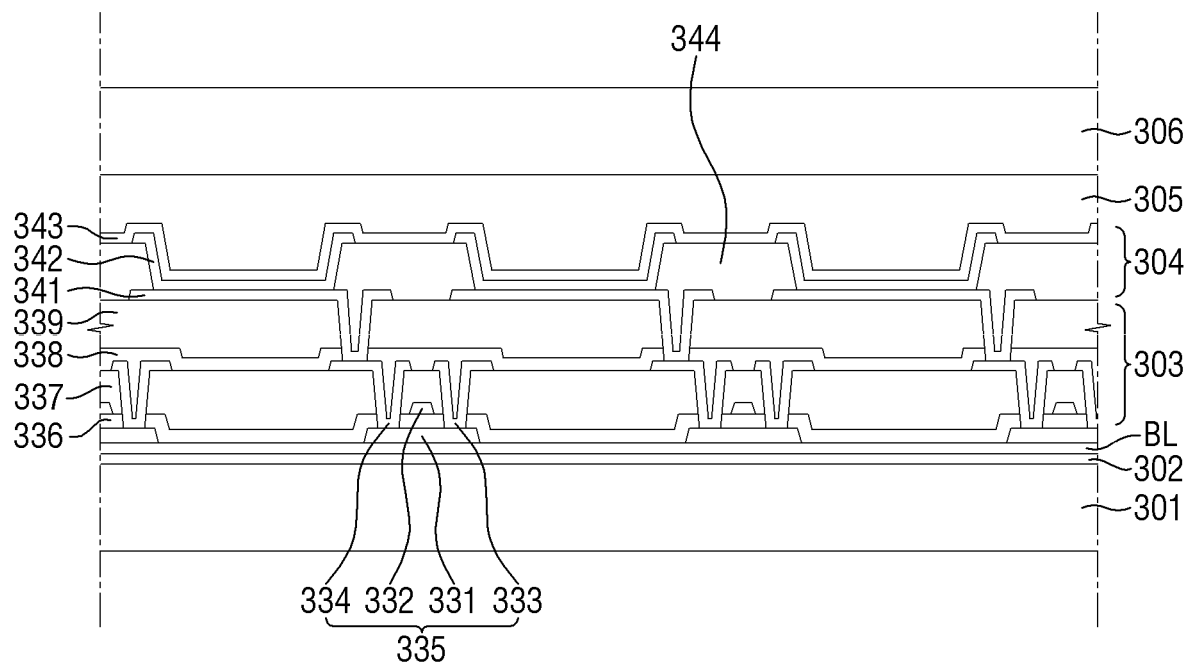
FIG. 7 is a cross-sectional view showing a display area of the display panel according to some example embodiments.

As shown in FIG. 7, the display area DA of the display panel 300 refers to an area where a light emitting element layer 304 is formed to display an image (e.g., static or video images), and the non-display area NDA thereof refers to an area around the display area DA (e.g., a bezel area). The display panel 300 may include a support substrate 301, a flexible substrate 302, a thin film transistor layer 303, a light emitting element layer 304, and a thin film encapsulation layer 305.

The flexible substrate 302 is located on the support substrate 301. Each of the support substrate 301 and the flexible substrate 302 may include a polymer material having flexibility. For example, each of the support substrate 301 and the flexible substrate 302 may include polyethersulphone (PES), polyacrylate (PA), polyarylate (PAR), polyetherimide (PEI), polyethylenenapthalate (PEN), polyethylene terepthalate (PET), polyphenylenesulfide (PPS), polyallylate, polyimide (PI), polycarbonate (PC), cellulosetriacetate (CAT), cellulose acetate propionate (CAP), or a combination thereof.

The thin film transistor layer 303 is located on the flexible substrate 302. The thin film transistor layer 303 includes thin film transistors 335, a gate insulating film 336, an interlayer insulating film 337, a protective film 338, and a planarization film 339.

A buffer film(BL) may be formed on the flexible substrate 302. The buffer film(BL) may be formed on the flexible substrate 302 so as to protect thin film transistors 335 and light emitting elements from moisture penetrating through the support substrate 301 and the flexible substrate 302 which are vulnerable to moisture. The buffer film(BL) may be formed of a plurality of alternately laminated inorganic films. For example, the buffer film(BL) may be formed of a multi-layer film in which one or more inorganic layers including one or more of a silicon oxide (SiOx), a silicon nitride (SiNx), and SiON are alternately stacked. The buffer film(BL) may be omitted.

The thin film transistor 335 is formed on the buffer film(BL). The thin film transistor 335 includes an active layer 331, a gate electrode 332, a source electrode 333, and a drain electrode 334. Although it is shown in FIG. 7 that the thin film transistor 335 is formed by a top gate manner in which the gate electrode 332 is located on the active layer 331, it should be noted that embodiments according to the present invention are not limited thereto. That is, the thin film transistor 335 may be formed by a bottom gate manner in which the gate electrode 332 is located beneath the active layer 331, or may be formed by a double gate manner in which the gate electrode 332 is located both on and beneath the active layer 331.

The active layer 331 is formed on the buffer film(BL). The active layer 331 may be formed of a silicon-based semiconductor material or an oxide-based semiconductor material. A light blocking layer for blocking external light incident on the active layer 331 may be formed between the buffer film(BL) and the active layer 331.

The gate insulating film 336 may be formed on the active layer 331. The gate insulating film 336 may be formed of an inorganic film, for example, a silicon oxide (SiOx) film, a silicon nitride (SiNx) film, or a combination thereof.

The gate electrode 332 and a gate line may be formed on the gate insulating film 336. The gate electrode 332 and the gate line may be formed of a single layer or a multi-layer including at least one of molybdenum (Mo), aluminum (Al), chromium (Cr), gold (Au), titanium (Ti), nickel (Ni), neodymium (Nd) or copper (Cu), or an alloy thereof.

The interlayer insulating film 337 may be formed on the gate electrode 332 and the gate line. The interlayer insulating film 337 may be formed of an inorganic film, for example, a silicon oxide (SiOx) film, a silicon nitride (SiNx) film, or a combination thereof.

The source electrode 333, the drain electrode 334, and a data line may be formed on the interlayer insulating film. Each of the source electrode 333 and the drain electrode 334 may be connected to the active layer 331 through a contact hole penetrating the gate insulating film 336 and the interlayer insulating film 337. The source electrode 333, the drain electrode 334, and the data line may be formed of a single layer or a multi-layer including at least one of molybdenum (Mo), aluminum (Al), chromium (Cr), gold (Au), titanium (Ti), nickel (Ni), neodymium (Nd), or copper (Cu), or an alloy thereof.

The protective film 338 for insulating the thin film transistor 335 may be formed on the source electrode 333, the drain electrode 334, and the data line. The interlayer insulating film 338 may be formed of an inorganic film, for example, a silicon oxide (SiOx) film, a silicon nitride (SiNx) film, or a combination thereof.

The planarization film 339 for flattening a step due to the thin film transistor 335 may be formed on the protective film 338. The planarization film 339 may be formed of an organic film including an acryl resin, an epoxy resin, a phenolic resin, a polyamide resin, or a polyimide resin.

The light emitting element layer 304 is formed on the thin film transistor layer 303. The light emitting element layer 304 includes light emitting elements and a pixel defining film 344.

The light emitting elements and the pixel defining film 344 are formed on the planarization film 339. The light emitting element may be an organic light emitting element. In this case, the light emitting element may include an anode electrode 341, a light emitting layer 342, and a cathode electrode 343.

The anode electrode 341 may be formed on the planarization film 339. The anode electrode 341 may be connected to the source electrode 333 of the thin film transistor 335 through a contact hole penetrating the protective film 338 and the planarization film 339.

The pixel defining film 344 may be formed on the planarization film 339 to cover the edge of the anode electrode 341 so as to partition pixels. That is, the pixel defining film 344 serves to define pixels. Each of the pixels refers to an area where the anode electrode 341, the light emitting layer 342, and the cathode electrode 343 are sequentially laminated, and holes from the anode electrode 341 and electrons from the cathode electrode 343 are combined with each other in the light emitting layer 342 to emit light.

The light emitting layers 342 are formed on the anode electrode 341 and the pixel defining film 344. The light emitting layer 342 is an organic light emitting layer. The light emitting layer 342 may emit one of red light, green light, and blue light. The peak wavelength range of red light may be about 620 nm to 750 nm, and the peak wavelength range of green light may be about 495 nm to 570 nm. Further, the peak wavelength range of blue light may be about 450 nm to 495 nm. The light emitting layer 342 may be a white light emitting layer that emits white light. In this case, the light emitting layer 342 may have a laminate structure of a red light emitting layer, a green light emitting layer, and a blue light emitting layer, and may be a common layer formed commonly in the pixels. In this case, the display panel 300 may further include color filters for displaying red, green, and blue colors.

The light emitting layer 342 may include a hole transporting layer, a light emitting layer, and an electron transporting layer. Further, the light emitting layer 342 may be formed to have a tandem structure of two stacks or more, and in this case, a charge generating layer may be formed between the stacks.

The cathode electrode 343 is formed on the light emitting layer 342. The second electrode 343 may be formed to cover the light emitting layer 342. The second electrode 343 may be a common layer formed commonly in the pixels.

When the light emitting element layer 304 is formed by a top emission manner in which light is emitted upward, the anode electrode 341 may be formed of a high-reflectance metal material such as a laminate structure (Ti/Al/Ti) of aluminum and titanium, a laminate structure (ITO/Al/ITO) of aluminum and TIO, an APC alloy, or a laminate structure (ITO/APC/ITO) of an APC alloy and ITO. The APC alloy may be an alloy of silver (Ag), palladium (Pd), and copper alloy (Cu). The cathode electrode 263 may be formed of a transparent conductive material (TCO) such as ITO or IZO, which is light-transmissive, or a semi-transmissive conductive material such as magnesium (Mg), silver (Ag), or an alloy of magnesium (Mg) and silver (Ag). When the cathode electrode 343 is formed of a semi-transmissive conductive material, light emission efficiency may be increased by a microcavity.

When the light emitting element layer 304 is formed by a bottom emission manner in which light is emitted downward, the anode electrode 341 may be formed of a transparent conductive material (TCO) such as ITO or IZO, or a semi-transmissive conductive material such as magnesium (Mg), silver (Ag), or an alloy of magnesium (Mg) and silver (Ag). The second electrode 343 may be formed of a high-reflectance metal material such as a laminate structure (Ti/Al/Ti) of aluminum and titanium, a laminate structure (ITO/Al/ITO) of aluminum and TIO, an APC alloy, or a laminate structure (ITO/APC/ITO) of an APC alloy and ITO. When the anode electrode 341 is formed of a semi-transmissive conductive material, light emission efficiency may be increased by a microcavity.

The thin film encapsulation layer 305 is formed on the light emitting element layer 304. The thin film encapsulation layer 305 serves to prevent or reduce contaminants, such as oxygen or moisture, permeating the light emitting layer 342 and the cathode electrode 343. For this purpose, the thin film encapsulation layer 305 may include at least one inorganic film. The inorganic film may be formed of silicon nitride, aluminum nitride, zirconium nitride, titanium nitride, hafnium nitride, tantalum nitride, silicon oxide, aluminum oxide, or titanium oxide. The thin film encapsulation layer 305 may further include at least one organic film. The organic film may be formed to have a sufficient thickness to prevent foreign matter (particles) from penetrating the thin film encapsulation layer 305 and entering the light emitting layer 342 and the cathode electrode 343. The organic film may include any one of epoxy, acrylate, and urethane acrylate.

The display circuit board 310 may be attached to one side of the display panel 300. For example, the display circuit board 310 may be attached onto pads provided on one side of the display panel 300 using an anisotropic conductive film. The display circuit board 310 may be bent toward the lower surface of the display panel 300. The touch circuit board 210 may also bent or curved toward the lower surface of the display panel 300. Thus, the touch connection portion provided at one end of the touch circuit board 210 may be connected to the touch connector 312a of the display circuit board 310. Further details of the display circuit board 310 will be described later with reference to FIGS. 3 and 4.

The display driver 320 outputs signals and voltages for driving the display panel 300 through the display circuit board 310. The display driver 320 may be formed as an integrated circuit and mounted on the display circuit board 310, but embodiments according to the present invention are not limited thereto. For example, the display driver 320 may be attached directly to the substrate of the display panel 300. In this case, the display driver 320 may be attached to the upper surface or lower surface of the display panel 300.

The panel lower member 400 may be located under the display panel 300 as shown in FIG. 6. The panel lower member 400 may be attached to the lower surface of the display panel 300 through the third adhesive member 930. The third adhesive member 930 may be an optical clear adhesive (OCA) film or an optical clear resin (OCR) film.

The panel lower member 400 may include at least one of a light absorbing member for absorbing external light, a buffer member for absorbing an external impact, a heat dissipating member for efficiently emitting heat of the display panel 300, or a light blocking layer for blocking external light.

The light absorbing member may be located under the display panel 300. The light absorbing member inhibits the transmission of light to prevent components located under the light absorbing member, that is, a first pressure sensor 510, a second pressure sensor 520, the display circuit board 310, and the like from being viewed from above the display panel 300. The light absorbing member may include a light absorbing material such as a black pigment or a dye.

The buffer member may be located under the light absorbing member. The buffer member absorbs an external impact to prevent or reduce instances of the display panel 300 being damaged. The buffer member may be composed of a single layer or a plurality of layers. For example, the buffer member may be formed of a polymer resin such as polyurethane, polycarbonate, polypropylene, or polyethylene, or may be formed of an elastic material such as a rubber, a urethane material, or a sponge formed by foaming an acrylic material. The buffer member may be a cushion layer.

The heat dissipating member may be located under the buffer member. The heat dissipating member may include a first heat dissipating layer including graphite or carbon nanotubes and a second heat dissipating layer capable of blocking electromagnetic waves and formed of a metal thin film of copper, nickel, ferrite or silver having excellent thermal conductivity.

The first pressure sensor 510 and the second pressure sensor 520 may be located in the second regions DR2. That is, the first pressure sensor 510 may be located under the display panel 300 at the right edge of the display panel 300. The second pressure sensor 520 may be located under the display panel 300 at the left edge of the display panel 300. As shown in FIGS. 1 and 2, the left and right sides of the display panel 300 face each other. Thus, according to some example embodiments, one or more pressure sensors (e.g., 510 and 520) may be located at one more edges (e.g., at a bent or curved edge or region) of the display panel for sensing a touch input.

The first pressure sensor 510 and the second pressure sensor 520 may be attached to the lower surface of the panel lower member 400. The first pressure sensor 510 and the second pressure sensor 520 may be connected to the display circuit board 310 through the pressure sensing circuit board 550. Although it is shown in FIG. 3 that the first pressure sensor 510 and the second pressure sensor 520 are connected to one pressure sensing circuit board 550, embodiments according to the present invention are not limited thereto. The first pressure sensor 510 and the second pressure sensor 520 may be connected to the display circuit board 310 through different pressure sensing circuit boards 550.

As shown in FIG. 3, the pressure sensing unit 330 for sensing pressure by driving the first pressure sensor 510 and the second pressure sensor 520 may be mounted on the display circuit board 310. In this case, the pressure sensing unit 330 may be formed as an integrated circuit. The pressure sensing unit 330 may be integrated with the display driver 320 to form one integrated circuit.

Alternatively, the pressure sensing circuit board 550 may be connected to the touch circuit board 210 rather than the display circuit board 310. In this case, the pressure sensing unit 330 may be mounted on the touch circuit board 210. The pressure sensing unit 330 may be integrated with the touch driver 220 to form one integrated circuit.

The lower frame 600 may be located under the panel lower member 400. The lower frame 600 may include a synthetic resin, a metal, or both a synthetic resin and a metal.

The waterproof member 610 may be located at the edge of the lower frame 600. The waterproof member 610 may be located on the outer side of the first pressure sensor 510 and the outer side of the second pressure sensor 520. The waterproof member 610 may be attached to the upper surface of the panel lower member 400 and the lower surface of the lower frame 600.

According to the embodiment shown in FIGS. 1 and 2, because the waterproof member 610 is located on the outer side of the first pressure sensor 510 and the outer side of the second pressure sensor 520, it may be possible to prevent or reduce contaminants, such as water or dust, penetrating between the display panel 300 and the lower frame 600 by the waterproof member 610. That is, a waterproof and dustproof display device 10 may be provided.

The lower frame 600 may provided with a first camera hole CMH1 into which a camera device 720 is inserted, a battery hole BH through which heat is discharged from a battery, and a cable hole CAH through which a second connection cable 314 connected to the display circuit board 310 passes. For example, the cable hole CAH may be located at the right edge of the frame 600, and in this case, the cable hole CAH may be shrouded by the first pressure sensor 510 located under the panel lower member 400 at the right edge of the display panel 300. Therefore, the first pressure sensor 510 may include a first concave portion NTH1 formed concavely in a notch shape at one side of the first pressure sensor 510 in order to expose the cable hole CAH without being shrouded, as shown in FIG. 2.

Further, the lower frame 600 is located under the lower panel member 400 of the display panel 300, the first pressure sensor 510, and the second pressure sensor 520. When pressure is applied to the first pressure sensor 510 and the second pressure sensor 520, the lower frame 600 may support the first pressure sensor 510 and the second pressure sensor 520. Accordingly, the first pressure sensor 510 and the second pressure sensor 520 may sense the applied pressure.

The main circuit board 700 may be located under the lower frame 600. The main circuit board 700 may be a printed circuit board or a flexible printed circuit board.

The main circuit board 700 may include a main processor 710, a camera device 720, and a main connector 730. The main processor 710 and the main connector 730 may be located on the lower surface of the main circuit board 700, facing the lower cover 900. The camera device 720 may be arranged on both the upper surface and lower surface of the main circuit board 700.

The main processor 710 may control all the functions of the display device 10. For example, the main processor 710 may output image data to the display driver 320 of the display circuit board 310 such that the display panel 300 displays an image. Further, the main processor 710 may receive touch data from the touch driver 220, determine the touch position of a user, and then execute an application indicated by an icon displayed at the touch position of the user. Further, the main processor 710 may receive pressure sensing data from the pressure sensing unit 330, and may execute an application indicated by an icon displayed at the touch position of the user depending on the pressure sensing data. Further, the main processor 710 may vibrate a vibration generator 901 to control to implement haptic. The main processor 710 may be an application processor, a central processing unit, or a system chip, which includes an integrated circuit.

The camera device 720 processes an image frame such as a still image or a moving image obtained by an image sensor in a camera mode, and outputs the processed image frame to the main processor 710.

The second connection cable 314 having passed through the connector hole CAH of the lower frame 600 may be connected to the main connector 730 located on the lower surface of the main circuit board 700 through the gap GAP between the frame 600 and the main circuit board 700. Thus, the main circuit board 910 can be electrically connected to the display circuit board 310 and the touch circuit board 210.

In addition, the main circuit board 700 may be further provided with a mobile communication module capable of transmitting and receiving a radio signal to/from at least one of a base station, an external terminal, or a server. The radio signal may include various types of data depending on a voice signal, a video call signal, or a text/multimedia message transmission/reception. Further, the main circuit board 700 may be further provided with an acoustic output device capable of outputting sound and a vibration device capable of generating vibration for haptic implementation.

The lower cover 900 may be located under the lower frame 600 and the main circuit board 700. The lower cover 900 may be engaged and fixed to the lower frame 600. The lower cover 900 may form a lower surface appearance of the display device 10. The lower cover 900 may include plastic and/or metal.

The lower cover may be provided with a second camera hole CMH2 into which the camera device is inserted to protrude outward. The position of the camera device 720 and the positions of the first and second camera holes CMH1 and CMH2 corresponding to the camera device 720 are limited to the embodiment shown in FIGS. 1, 2, 4, and 5.

Further, the vibration generator 901 may be located on the upper surface of the lower cover 900, and may be connected to the lower surface of the main circuit board 700. Thus, the vibration generator 901 may generate vibration in response to the vibration signal of the main processor 710. The vibration generator 901 may be any one of an eccentric rotating motor (ERM), a linear resonant actuator LRA, and a piezoelectric actuator.

Figure 4:
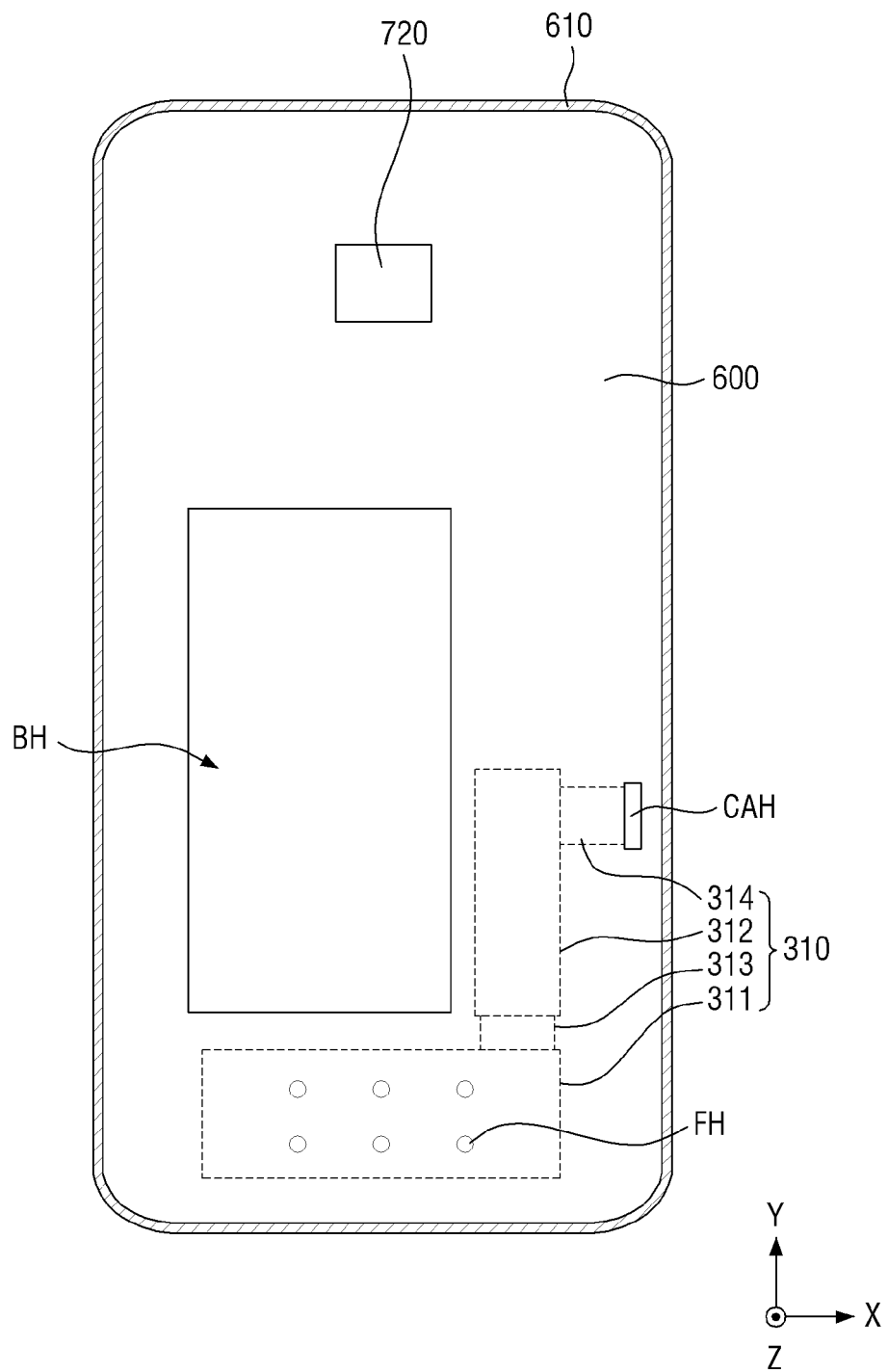
FIG. 4 is a plan view showing an example of the lower frame of FIG. 2.
Figure 5:
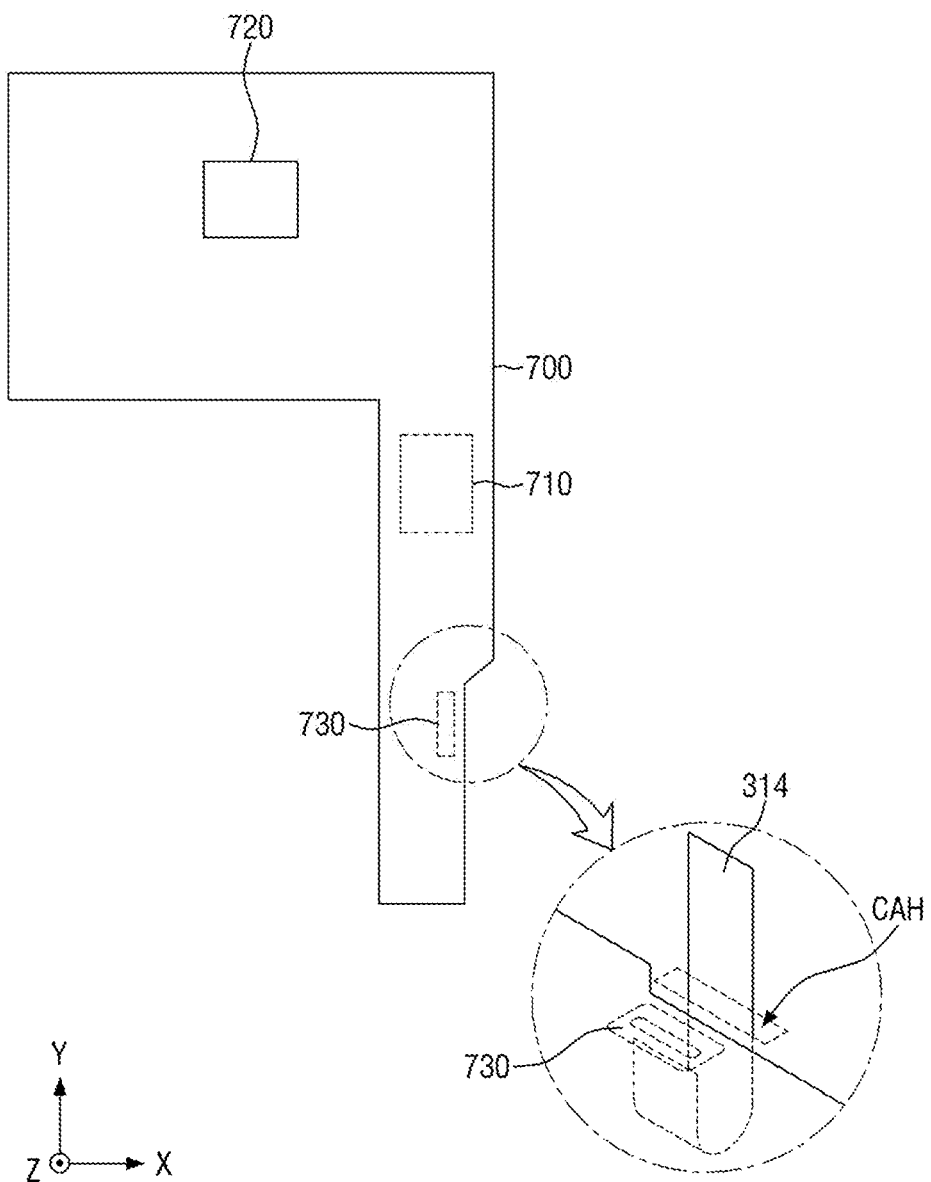
FIG. 5 is a plan view showing an example of the main circuit board of FIG. 2.

FIG. 3 is a bottom view showing an example of a display panel attached to the cover window FIG. 2, FIG. 4 is a plan view showing an example of the lower frame of FIG. 2, and FIG. 5 is a plan view showing an example of the main circuit board of FIG. 2.

Hereinafter, the connection between the display circuit board 310 and the third circuit board 550 and the connection between the second connection cable 314 and the main connector 730 of the main circuit board 700 will be described in detail with reference to FIGS. 3 to 5. Meanwhile, because FIGS. 3 and 5 are bottom views while FIG. 4 is a plan view, it should be noted that it is shown in FIGS. 3 and 5 that the left and right of the display device 10 in FIG. 4 are reversed. For convenience of explanation, in FIG. 4, the display circuit board 310 is expressed by a dotted line, and in FIG. 5, the second connection cable 314 is expressed by a dotted line.

Referring to FIGS. 3 to 5, the display circuit board 310 may include a first circuit board 311, a second circuit board 312, and a first connection cable 313.

The first circuit board 311 may be attached to one side of the upper surface or lower surface of the substrate of the display panel 300, and may be bent toward the lower surface of the display panel 300. As shown in FIG. 4, the first circuit board 311 may be fixed to fixing holes FH formed in the lower frame 600 by fixing members.

The first circuit board 311 may include a display driver 320, a pressure sensing unit 330, a first connector 311*a*, a second connector 311*b*, and a third connector 311*c*. The display driver 320, the pressure sensing unit 330, the first connector 311a, the second connector 311b, and the third connector 311c may be located on one surface of the first circuit board 311.

The first connector 311a may be connected to one end of the first connection cable 313 connected to the second circuit board 312. Thus, the display driver 320 and the pressure sensing unit 330 mounted on the first circuit board 311 may be electrically connected to the second circuit board 312 through the first connection cable 313.

The second connector 311b may be connected to one end of the third circuit board 550 connected to the first pressure sensor 510 and the second pressure sensor 520. Thus, the first pressure sensor 510 and the second pressure sensor 520 may be electrically connected to the pressure sensing unit 330.

The second circuit board 312 may include a touch connector 312a, a first connection connector 312b, and a second connection connector 312c. The first connector 312b and the second connector 312c may be located on one surface of the second circuit board 312, and the touch connector 312a may be located on the other surface of the second circuit board 312.

The touch connector 312a may be connected to a touch connection portion provided at one end of the touch circuit board 210. Thus, the touch driver 220 may be electrically connected to the second circuit board 312.

The first connection connector 312b may be connected to the other end of the first connection cable 313 connected to the first circuit board 311. Thus, the display driver 320 and the pressure sensing unit 330 mounted on the first circuit board 311 may be electrically connected to the second circuit board 312 through the first connection cable 313.

The second connection connector 312c may be connected to one end of the second connection cable 314 connected to the main connector 730 of the main circuit board 700. Thus, the second circuit board 312 may be electrically connected to the second circuit board 312 through the second connection cable 314.

A connector connection portion 315 may be formed at the other end of the second connection cable 314. The connector connection portion 315 of the second connection cable 314 may extend to the lower surface of the lower frame 600 through the cable hole CAH of the lower frame 600 as shown in FIGS. 3 and 4. Because the first pressure sensor 510 may be provided one side thereof with a first concave portion NTH1 having a notch shape in a region corresponding to the cable hole CAH of the lower frame 600, the cable hole CAH of the lower frame 600 may be exposed without being covered by the first pressure sensor 510.

Further, as shown in FIG. 5, because a gap is formed between the lower frame 600 and the main circuit board 700, the connector connection portion 315 of the second connection cable 314, having passed through the cable hole CAH, may come out of the gap between the lower frame 600 and the main circuit board 700, and may extend to the lower surface of the main circuit board 700. Finally, the connector connection portion 315 of the second connection cable 314 may be connected to the main connector 730 located on the lower surface of the main circuit board 700.

According to the embodiment shown in FIGS. 3 to 5, the first concave portion NTH1 having a notch shape is formed in one side of the first pressure sensor 510 so as not to cover the cable hole CAH of the lower frame 600. Thus, the second connection cable 314 connected to the display circuit board 310 may extend to the lower surface of the lower frame 600 through the cable hole CAH, and thus may be connected to the main connector 730 of the main circuit board 700. Thus, the display circuit board 310 and the main circuit board 700 may be stably connected to each other.

FIG. 6 is a cross-sectional view taken along the line I-I' of FIG. 3.

Referring to FIG. 6, the cover window 100, the touch sensing unit 200, the display panel 300, the panel lower member 390, and the lower frame 600 may be formed to be flat in the first region DR1, and may be formed to be curved in the second region DR2.

The first pressure sensor 510 may be located in the second region DR2 corresponding to the curved portion of the display device 10. First bumps 530 are located on the first pressure sensor 510. Each of the first bumps 530 may be attached to the lower surface of the panel lower member 400 through the fourth adhesive member 940, and may be attached to the upper surface of the first pressure sensor 510 through the sixth adhesive member 960. Further, the first pressure sensor 510 may be attached to the upper surface of the lower frame 600 through the fifth adhesive member 950. The fourth adhesive member 940, the fifth adhesive member 950, and the sixth adhesive member 960 may be pressure-sensitive adhesive (PSA) members. Any one of the fourth adhesive member 940 and the fifth adhesive member 950 may be omitted.

The waterproof member 610 may be located on the outer side of the first pressure sensor 510. That is, the waterproof member 400 may be located on one side surface of the first pressure sensor 510, and one side surface of the first pressure sensor 510 may be located close to the one side edge of the display panel 300 as compared with other side surfaces of the first pressure sensor 510. For example, as shown in FIG. 6, when the first pressure sensor 510 is located at the right edge of the display panel 300, the waterproof member 610 may be located on the right side surface of the first pressure sensor 510.

The waterproof member 610 may be attached to the lower surface of the panel lower member 400 and the upper surface of the upper frame 600. For this purpose, the waterproof member 610 may include a base film, a first adhesive film located on one surface of the base film, and a second adhesive film located on the other surface of the base film. The base film may be a polyethylene terephthalate (PET) film, a polyethylene terephthalate (PET) film and a cushion layer, or a polyethylene foam (PE-foam). The first adhesive film and the second adhesive film may be pressure-sensitive adhesive films. The first adhesive film may be adhered to the upper surface of the panel lower member 400, and the second adhesive film may be adhered to the lower surface of the lower frame 600.

Because the waterproof member 610 is attached to the lower surface of the panel lower member 400 and the upper surface of the lower frame 600 by pressing, when the height of the waterproof member 610 is lower than the sum of the height of the first pressure sensor 510 and the height of the first bump 530, the first pressure sensor 510 may be damaged by a force for attaching the waterproof member 610. Therefore, according to some example embodiments, the height of the waterproof member 610 is higher than the sum of the height of the first pressure sensor 510 and the height of the first bump 530. However, when the height of the waterproof member 610 is much higher than the sum of the height of the first pressure sensor 510 and the height of the first bump 530, pressure may not be sensed by the first pressure sensor 510. Therefore, according to some example embodiments, the height of the waterproof member 610 is previously determined, considering that the first pressure sensor 510 is damaged by the force for attaching the waterproof member 610 and considering whether or not pressure is sensed by the first pressure sensor 510 after attachment of the waterproof member 610.

Further, in order for the first bump 530 to press the pressure sensing cells CE1 to CE8 of the first pressure sensor 510, according to some example embodiments, the height of the first bump 530 is higher than the height of the first pressure sensor 510.

Further, in order to prevent or reduce instances of penetration of moisture and dust, the width of the waterproof member 610 may be about 1 mm or more.

According to the embodiment shown in FIG. 6, because the waterproof member 610 is located on the outer side of the first pressure sensor 510 and is attached to the lower surface of the panel lower member 400 and the upper surface of the lower frame 600, it is possible to prevent moisture and dust from penetrating between the display panel 300 and the upper frame 600. That is, a waterproof and dustproof display device 10 may be provided.

Meanwhile, because the second pressure sensor 520 is located at the left edge of the display panel 300, the layout position of the waterproof member 610 may be different from that of the first pressure sensor 510 in that the waterproof member 610 is located on the left side of the second pressure sensor 520. Therefore, a detailed description of the layout positions of the second pressure sensor 520 and the waterproof member 610 will be omitted.

Figure 9:
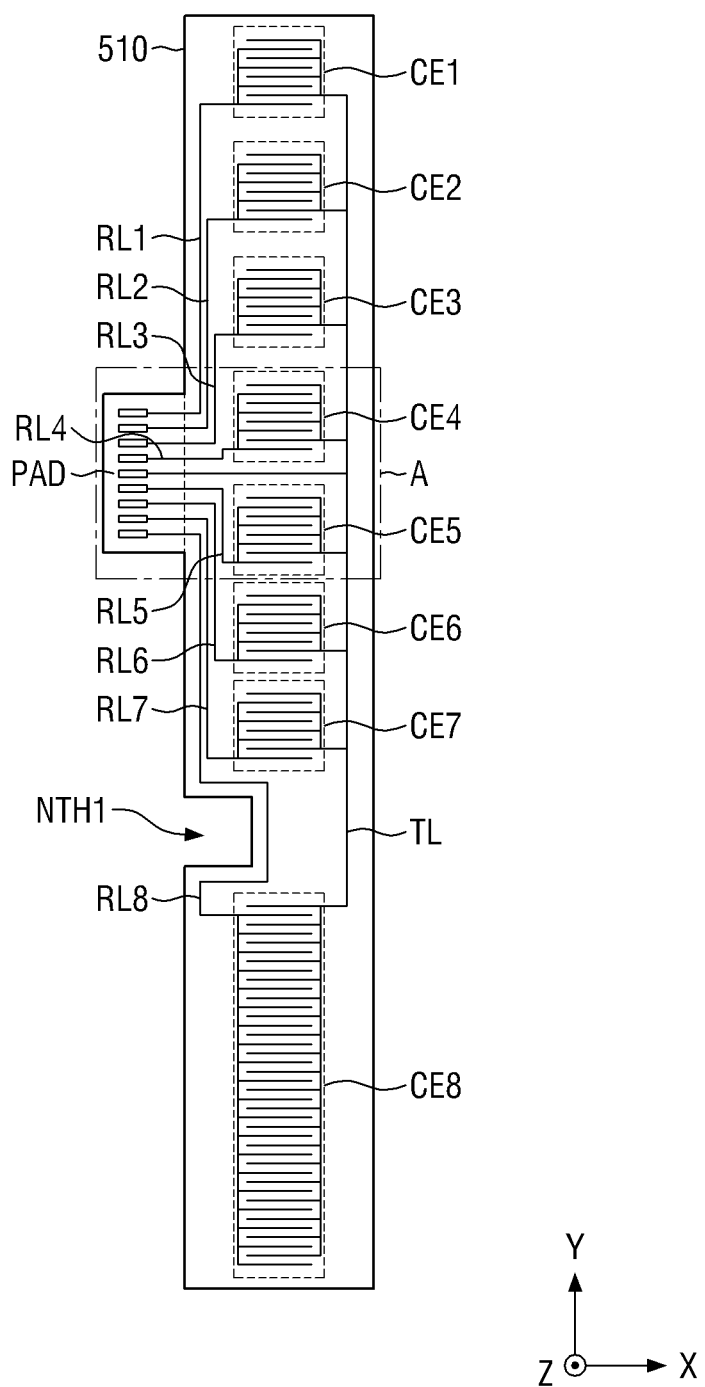
FIG. 9 is a plan view of a pressure sensor according to some example embodiments.

FIG. 8 is a perspective view of a pressure sensor according to an embodiment, and FIG. 9 is a plan view of a pressure sensor according to an embodiment.

Referring to FIGS. 8 and 9, the first pressure sensor 510 includes a first substrate SUB1, a driving line TL, sensing lines RL1 to RL8, and first to eighth pressure sensing cells CE1 to CE8, a driving pad TPD, and sensing pads RPD.

The first substrate SUB1 may include polyethylene, polyimide, polycarbonate, polsulfone, polyacrylate, polystyrene, polyvinyl chloride, polyvinyl alcohol, polynorbonene, or polyester. In an embodiment, the first substrate SUB1 may be formed of a polyethylene terephthalate (PET) film or a polyimide film.

The first substrate SUB1 may have a rectangular planar shape having short sides in the first direction (X-axis direction) and long sides in the second direction (Y-axis direction). However, the planar shape of the first substrate SUB1 is not limited thereto, and may vary depending on the applied position.

A concave portion NTH1 having a notch shape may be formed in the one side surface of the first substrate SUB1 not to cover the cable hole CAH of the lower frame 600.

The first substrate SUB1 may be provided with a pad portion PAD to which the pressure sensing circuit board 550 is attached. The pad portion PAD may protrude from one side surface of the first substrate SUB1. Although it is shown in FIGS. 8 and 9 that the pad portion PAD protrudes from one side surface corresponding to the long side of the first substrate SUB1, embodiments according to the present invention are not limited thereto.

The pad part PAD may include a driving pad TPD connected to the driving line TL and sensing pads RD connected to the sensing lines RL1 to RL8. The pressure sensing circuit board 550 may be attached onto the driving pad TPD and the sensing pads RD.

The pressure sensing cells CE1 to CE8 are located on the first substrate SUB1. Although it is shown in FIGS. 8 and 9 that the first pressure sensor 510 includes eight pressure sensing cells CE1 to CE8, the number of pressure sensing cells is not limited thereto.

The pressure sensing cells CE1 to CE8 may independently sense pressure at the corresponding positions, respectively. Although it is shown in FIGS. 8 and 9 that the pressure sensing cells CE1 to CE8 are arranged in one row, embodiments according to the present invention are not limited thereto. The pressure sensing cells CE1 to CE8 may be arranged in a plurality of rows, as necessary. The pressure sensing cells CE1 to CE8 may be spaced apart from each other at intervals (e.g., set or predetermined intervals) or continuously arranged, as shown in FIGS. 8 and 9.

The pressure sensing cells CE1 to CE8 may have different areas depending on usage. For example, the first to seventh pressure sensing cells CE1 to CE7 may be used as physical buttons such as volume control buttons VB+ and VB- or power buttons PB located at one edge of the display device 10. Alternatively, the eighth pressure sensing cell CE8 may be used as a button SQB for sensing user's squeezing pressure. In this case, the eighth pressure sensing cell CE8 may be formed to have a larger area than each of the first to seventh pressure sensing cells CE1 to CE7. The eighth pressure sensing cell CE8 may be formed to be longer than each of the first to seventh pressure sensing cells CE1 to CE7 in the length direction (Y-axis direction) of the first pressure sensor 510.

Although it is shown in FIGS. 8 and 9 that the first to seventh pressure sensing cells CE1 to CE7 used as physical buttons are formed to have the same area, embodiments according to the present invention are not limited thereto. That is, the areas of the first to seventh pressure sensing cells CE1 to CE7 may be different from each other. Alternatively, some of the first to seventh pressure sensing cells CE1 to CE7 may have the same area, and others thereof may also have the same area, but some thereof may have different areas from others thereof, respectively.

Each of the first to eighth pressure sensing cells CE1 to CE8 may include driving electrodes TE and sensing electrodes RE located on one surface of the first substrate SUB1, and a pressure sensing layer PSL located between the first substrate SUB1 and the driving electrodes TE and between the first substrate SUB1 and the sensing electrodes RE. The driving electrodes TE and the sensing electrodes RE may be alternately arranged. Any one of the driving electrodes TE may be connected to the driving line TL, and any one of the sensing electrodes RE may be connected to any one of the sensing lines RL1 to RL8. The pressure sensing layer PSL may overlap the driving electrodes TE and the sensing electrodes RE.

First, the pressure sensing layer PSL may be located on one surface of the first substrate SUB1. The driving line TL, the sensing lines RL1 to RL8, the driving pad TPD, and the sensing pad RPD are arranged on the pressure sensing layer PSL. The driving line TL is commonly connected to the pressure sensing cells CE1 to CE8, whereas the sensing lines RL1 to RL8 may be connected to the pressure sensing cells CE1 to CE8 in a one-to-one manner. The driving pad TPD may be connected to the driving line TL, and the sensing pads RPD may be connected to the sensing lines RL1 to RL8 in a one-to-one manner. Although it is shown in FIGS. 8 and 9 that the first pressure sensor 510 includes eight sensing lines RL1 to RL8, the number of sensing lines is not limited thereto.

Meanwhile, because the second pressure sensor 520 is merely different from the first pressure sensor shown in FIGS. 8 and 9 in that the second pressure sensor 520 does not include a concave portion NTH1, a detailed description of the second pressure sensor 520 will be omitted.

Figure 10:
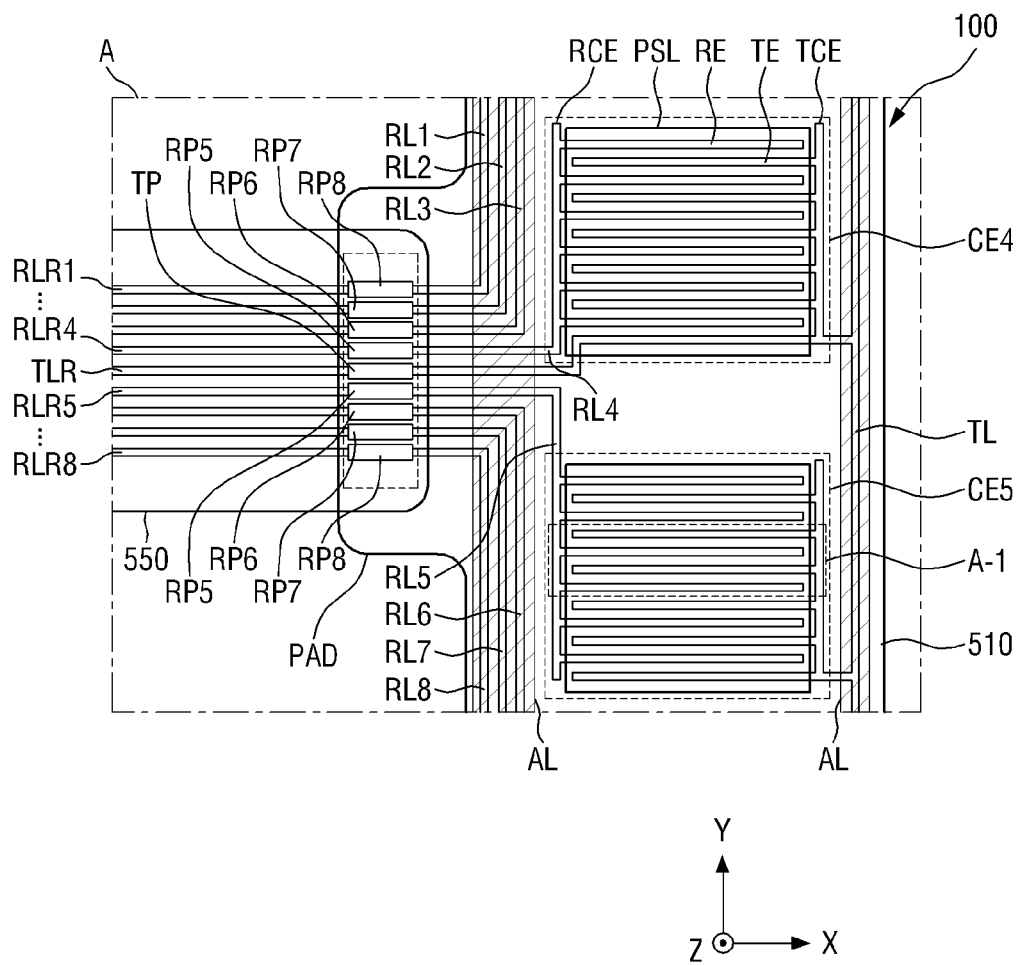
FIG. 10 is an enlarged plan view showing an example of the area A of FIG. 9.
Figure 11:
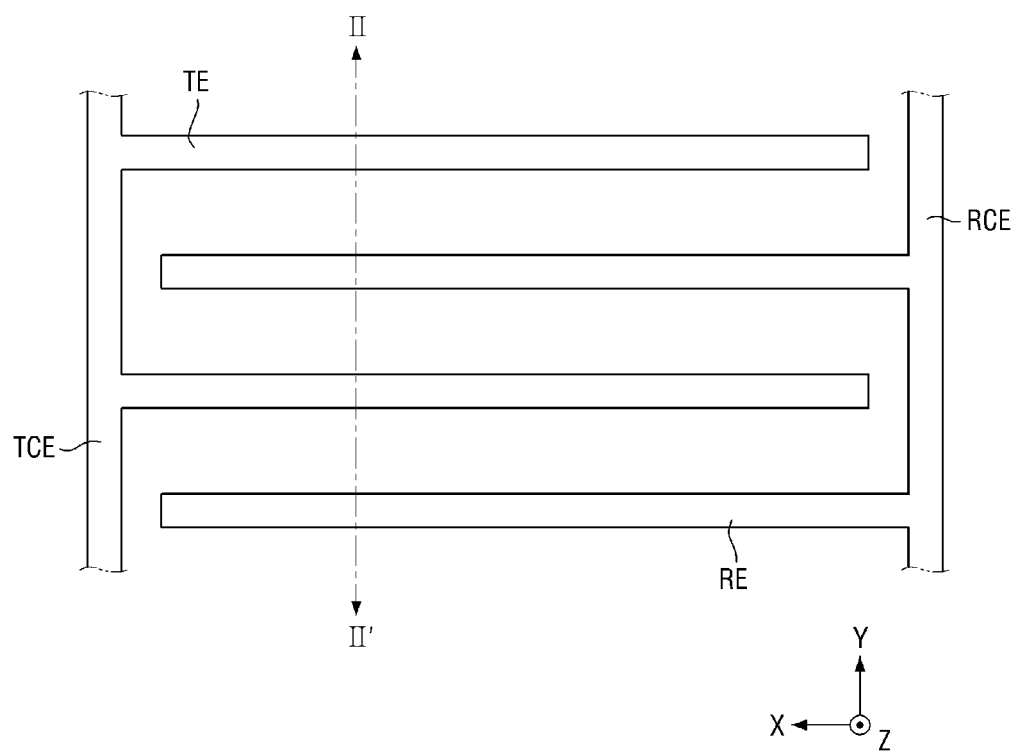
FIG. 11 is an enlarged plan view showing an example of the area A-1 of FIG. 10.
Figure 12:
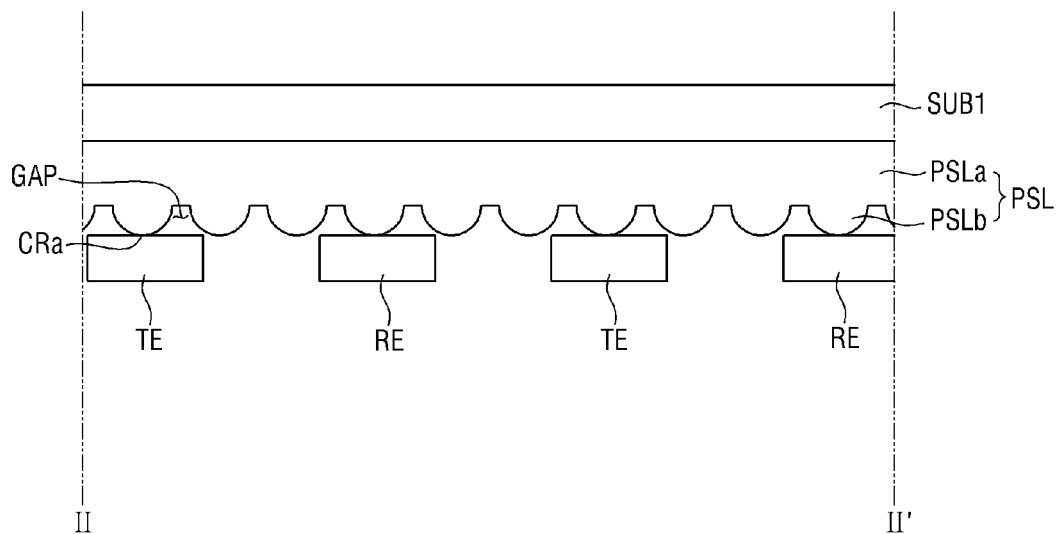
FIG. 12 is a cross-sectional view taken along the line II-II' of FIG. 11.
Figure 13:
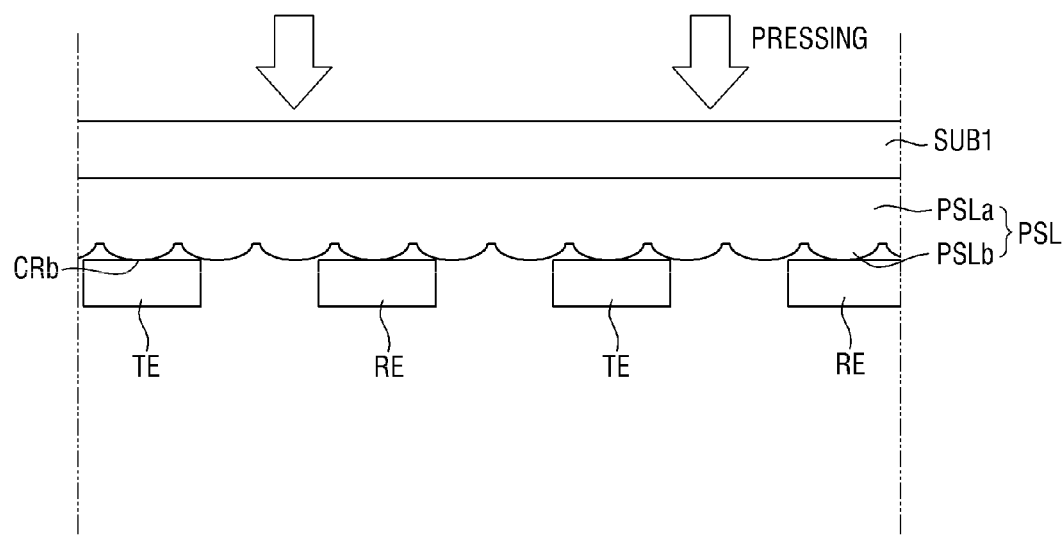
FIG. 13 is a cross-sectional view of a pressure sensor according to some example embodiments when pressure is applied.

FIG. 10 is an enlarged plan view showing an example of the area A of FIG. 9, FIG. 11 is an enlarged plan view showing an example of the area A-1 of FIG. 10, FIG. 12 is a cross-sectional view taken along the line II-II' of FIG. 11, and FIG. 13 is a cross-sectional view of a pressure sensor according to an embodiment when pressure is applied. FIG. 12 shows a cross-sectional view of a pressure sensor when pressure is not applied.

For convenience of explanation, FIG. 10 shows only the fourth pressure sensing cell CE4, the fifth pressure sensing cell CE5, the driving line TL, the first to eighth sensing lines RL1 to RL8 connected to the first to eighth pressure sensing cells CE1 to CE8, the driving pad TPD, and the sensing pad RPD. Further, FIG. 10 shows the pressure sensing circuit board 550 attached onto the driving pad TPD and the sensing pads RPD.

Referring to FIGS. 10 to 12, each of the pressure sensing cells CE1 to CE8 may be connected to at least one driving line and at least one sensing line. For example, the pressure sensing cells CE1 to CE8 are commonly connected to one driving line TL, whereas may be connected to the sensing lines RL1 to RL5 in a one-to-one manner. As shown in FIG. 10, the fourth pressure sensing cell CE4 may be connected to the driving line TL and the fourth sensing line RL4, and the fifth pressure sensing cell CE5 may be connected to the driving line TL and the fifth sensing line RL5. The driving line TL may be connected to the driving pad TPD, and the sensing lines RL1 to RL5 may be connected to the sensing pads RPD in a one-to-one manner.

The pad portion PAD may be provided with the driving pad TPD and the sensing pads RP1 to RP8. The driving pad TPD may be connected to the driving lead line TRR of the pressure sensing circuit board 550, and the sensing pads RP1 to RP8 may be connected to the sensing lead lines RLR1 to RLR8 of the pressure sensing circuit board 550 in a one-to-one manner. Because the pressure sensing circuit board 550 is connected to the display circuit board 310, the first pressure sensor 510 may be electrically connected to the pressure sensing unit 330 mounted on the display circuit board 310. Therefore, the pressure sensing unit 330 may apply a driving voltage to the driving line TL through the driving lead line TRL of the pressure sensing circuit board 550 and the driving pad TPD of the first pressure sensor 510. The pressure applied to the cells CE1 to CE8 may be sensed by sensing current values or voltage values from the sensing lines RL1 to RL8 through the sensing lead lines RLR1 to RLR8 connected to the sensing pads RP1 to RP8 of the first pressure sensor 510.

As shown in FIG. 11, each of the pressure sensing cells CE1 to CE8 includes a driving connection electrode TCE, a sensing connection electrode RCE, driving electrodes TE, sensing electrodes RE, and a pressure sensing layer PSL.

The driving connection electrode TCE, the sensing connection electrode RCE, the driving electrodes TE, and the sensing electrodes RE are arranged on one surface of the first substrate SUB1.

The driving connection electrode TCE is connected to the driving line TL and the driving electrodes TE. For example, the driving connection electrode TCE is connected to the driving line TL at one end in the length direction (Y-axis direction). The driving electrodes TE may be branched in the width direction (X-axis direction) of the driving connection electrode TCE.

The sensing connection electrode RCE is connected to any one of the sensing lines RL1 to RL8 and the sensing electrodes RE. For example, the sensing connection electrode TCE is connected to any one of the sensing lines RL1 to RL8 at one end in the length direction (Y-axis direction). The sensing electrodes RE may be branched in the width direction (X-axis direction) of the sensing connection electrode RCE.

The driving electrodes TE and the sensing electrodes RE are located adjacent to each other, but are not connected to each other. The driving electrodes TE and the sensing electrodes RE may be located in parallel to each other. The driving electrodes TE and the sensing electrodes RE may be alternately arranged in the length direction (Y-axis direction) of the driving connection electrode TCE and the sensing connection electrode RCE. That is, the driving electrodes TE and the sensing electrodes RE may be repeatedly arranged in order of the driving electrode TE, the sensing electrode RE, the driving electrode TE, and the sensing electrode RE in the length direction (Y-axis direction) of the driving connection electrode TCE and the sensing connection electrode RCE.

The driving line TL, the sensing lines RL1 to RL8, the driving connection electrodes TCE, the sensing connection electrodes RCE, the driving electrodes TE, and the sensing electrodes RE may be arranged on the same layer. The driving line TL, the sensing lines RL1 to RL8, the driving connection electrodes TCE, the sensing connection electrodes RCE, the driving electrodes TE, and the sensing electrodes RE may include the same material. For example, the driving line TL, the sensing lines RL1 to RL8, the driving connection electrodes TCE, the sensing connection electrodes RCE, the driving electrodes TE, and the sensing electrodes RE may include a conductive material such as silver (Ag) or copper (Cu). The driving line TL, the sensing lines RL1 to RL8, the driving connection electrodes TCE, the sensing connection electrodes RCE, the driving electrodes TE, and the sensing electrodes RE may be formed on the first substrate SUB1 and the pressure sensing layer PSL by a screen printing method.

The pressure sensing layer PSL is located on one surface of the first substrate SUB1. The pressure sensing layer PSL may be arranged to overlap the driving electrodes TE and the sensing electrodes RE. The pressure sensing layer PSL may be directly located on one surface of the first substrate SUB1.

The pressure sensing layer PSL may include a polymer resin having a pressure sensitive material. The pressure sensitive material may be fine metal particles (or metal nanoparticles) of nickel, aluminum, titanium, tin, or copper. For example, the pressure sensing layer PSL may be a quantum tunneling composite (QTC).

Referring to FIG. 11, When no pressure is applied in the height direction (Z-axis direction) of the first pressure sensor 510, the driving electrode TE and the sensing electrode RE may be arranged directly on the pressure sensing layer PSL, respectively. The driving electrode TE and the sensing electrode RE may be in direct contact with the pressure sensing layer PSL. Hereinafter, the contact area between the driving electrode TE and the sensing the pressure sensing layer PSL and the contact area between the sensing electrode RE and the sensing the pressure sensing layer PSL will be referred to as a first contact area CRa.

The pressure sensing layer PLS may include surface irregularities. The surface irregularities may include convex portions whose surfaces protrude in the thickness direction, and concave portions whose surfaces are indented from the thickness direction. In other words, the pressure sensing layer PSL may include a first portion PSLa and a second portion PSLb. The first portion PLSa of the pressure sensing layer PLS may be directly arranged on one surface of the first substrate SUB1. The first portion PLSa of the pressure sensing layer PLS may have a generally flat surface shape. The second portion PLSb of the pressure sensing layer PLS may protrude from the first portion PSa of the pressure sensing layer PLS in the thickness direction (downward direction). The pressure sensing layer PLS may include a plurality of second portions PLSb. A portion where the plurality of second portions PSLb of the pressure sensing layers PSL overlap the first portion PLSa of the pressure sensing layer PLS may be the convex portion of the pressure sensing layer PLS, and a portion where the second portions PSLb of the pressure sensing layers PSL are not located and only the first portion PLSa of the pressure sensing layer PLS is located may be the concave portion of the pressure sensing layer PLS.

The first portion PLSa of the pressure sensing layer PLS may be spaced apart from the driving electrode TE and the sensing electrode RE by the thickness of the second portion PLSb of the pressure sensing layer PLS. That is, as shown in FIG. 11, the first portion PLSa of the pressure sensing layer PLS may be spaced apart from the driving electrode TE and the sensing electrode RE with a gap (e.g., a set or predetermined gap) GAP therebetween.

The cross-section of the second portion PLSb of the pressure sensing layer PSL may have a semi-circular shape or a semi-elliptic shape.

As shown in FIG. 12, when pressure is applied to the first pressure sensor 510 in the thickness direction, as the second portion PSLb of the pressure sensing layer PSL is crushed, the contact area between the second portion PSLb of the pressure sensing layer PSL and the driving electrode TE and the contact area between the second portion PSLb of the pressure sensing layer PSL and the sensing electrode RE may be increased. Hereinafter, the sum of the contact area between the second portion PSLb of the pressure sensing layer PSL and the driving electrode TE and the contact area between the second portion PSLb of the pressure sensing layer PSL and the sensing electrode RE will be referred to as a second contact area CRb.

As a difference between the first contact area CRa when pressure is not applied and the second contact area CRb when pressure is applied increases, the acceptable change in resistance value of the sensing line may increase. The fact that the acceptable change in resistance value of the sensing line increases means that an acceptable change in pressure increases.

When the pressure sensing layer PSL and the driving electrode TE and the sensing electrode RE are located on different substrates from each other, a gap exists between the pressure sensing layer PSL and the driving electrodes TE and between the pressure sensing layer PSL and the sensing electrodes RE. That is, when pressure is not applied to a substrate on which the pressure sensing layer PSL is located or a substrate on which the driving electrode TE and the sensing electrode RE are located, the pressure sensing layer PSL may be spaced apart from the driving electrodes TE and the sensing electrodes RE.

Because the pressure sensing layer PSL and the driving electrode TE and the sensing electrode RE are located on different substrates from each other, process procedures such as need for more process masks may be complicated, and the overall thickness of the first pressure sensor 510 may be increased. Further, as described above, because a gap exists between the pressure sensing layer PSL and the driving electrodes TE and between the pressure sensing layer PSL and the sensing electrodes RE, when bending or folding the display device 10, a decrease in reliability and a decrease in sensitivity of the first pressure sensor 510 may occur.

However, in the first pressure sensor 510 of the display device 10 according to an embodiment, the driving electrode TE and the sensing electrode RE are directly located on the pressure sensing layer PSL to implement the first pressure sensor 510 of one layer, thereby decreasing the overall thickness of the first pressure sensor 510 and simplifying process procedures. Moreover, as described above, when pressure is applied, a gap does not exist between the pressure sensing layer PSL and the driving electrodes TE and between the pressure sensing layer PSL and the sensing electrodes RE, so that it is possible to prevent the occurrence of a decrease in reliability and a decrease in sensitivity of the first pressure sensor 510 when bending or folding the display device 10.

Moreover, when the driving electrode TE and the sensing electrode RE are directly located on the pressure sensing layer PSL, in the case where the pressure sensing layer PSL has a flat shape, differences in contact areas CRa and CRb according to a case where pressure is applied to the first pressure sensor 510 and a case where pressure is not applied thereto may not occur.

However, because the first pressure sensor 510 according to an embodiment includes surface irregularities protruding toward the driving electrode TE and the sensing electrode RE, differences in contact areas CRa and CRb according to a case where pressure is applied to the first pressure sensor 510 and a case where pressure is not applied thereto may be greatly increased. Thus, an acceptable change in pressure of the first pressure sensor 510 of one layer may be increased.

Hereinafter, other embodiments of the display device will be described. In the following embodiments, the same components as those already described in the above embodiments are referred to by the same reference numerals, and descriptions thereof will be omitted or simplified.

Figure 14:
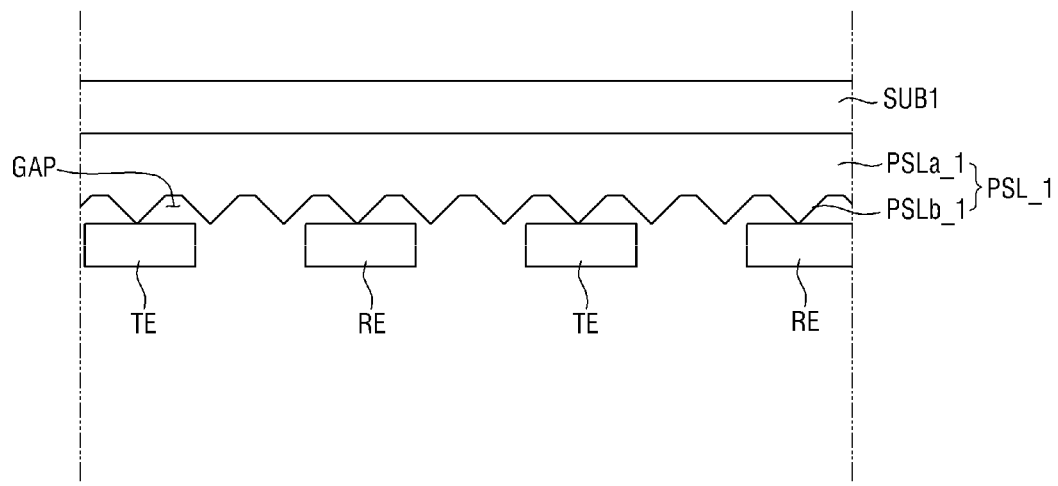
FIG. 14 is a cross-sectional view of a pressure sensor according to some example embodiments.
Figure 15:
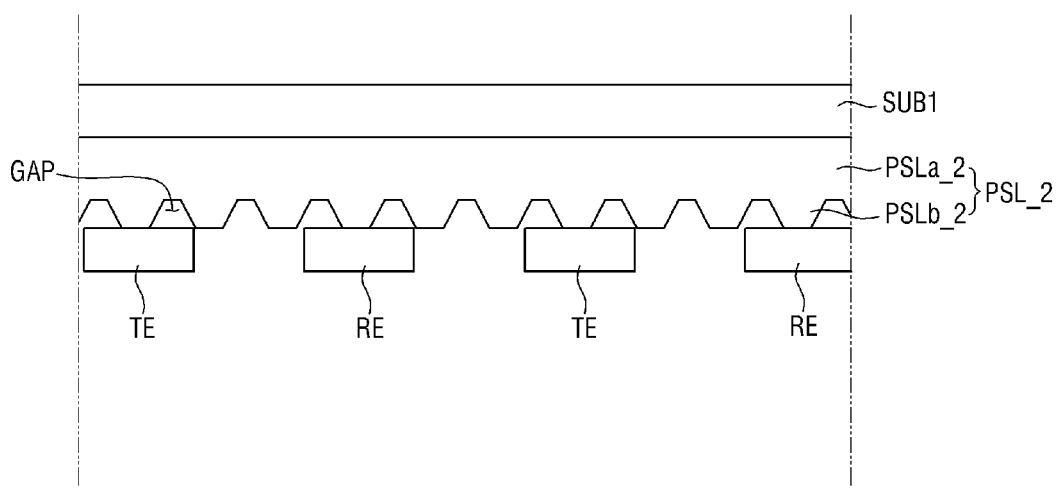
FIG. 15 is a cross-sectional view of a pressure sensor according to some example embodiments.
Figure 16:
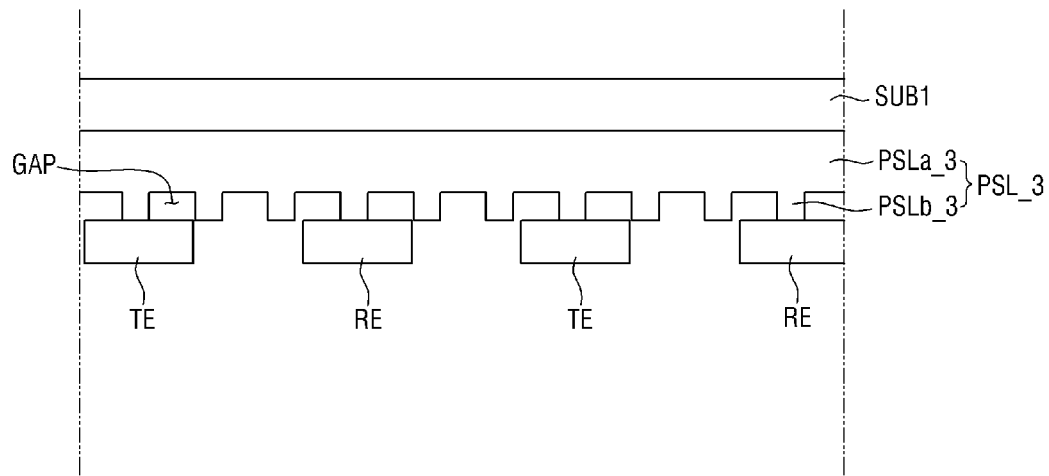
FIG. 16 is a cross-sectional view of a pressure sensor according to some example embodiments.

FIG. 14 is a cross-sectional view of a pressure sensor according to another embodiment, FIG. 15 is a cross-sectional view of a pressure sensor according to still another embodiment, and FIG. 16 is a cross-sectional view of a pressure sensor according to still another embodiment.

Referring to FIGS. 14 to 16, the first pressure sensors according to these embodiments illustrate that the cross-sectional shape of the second portion PSLb of the pressure sensing layer PSL of FIG. 12 may be variously modified.

Referring to FIG. 14, the cross-sectional shape of a second portion PSLb_1 of a pressure sensing layer PSL_1 may be triangular. Referring to FIG. 15, the cross-sectional shape of a second portion PSLb_2 of a pressure sensing layer PSL_2 may be trapezoidal. Referring to FIG. 16, the cross-sectional shape of a second portion PSLb_3 of a pressure sensing layer PSL_3 may be rectangular.

Other descriptions have been described above with reference to FIG. 12, and redundant descriptions will be omitted.

Figure 17:
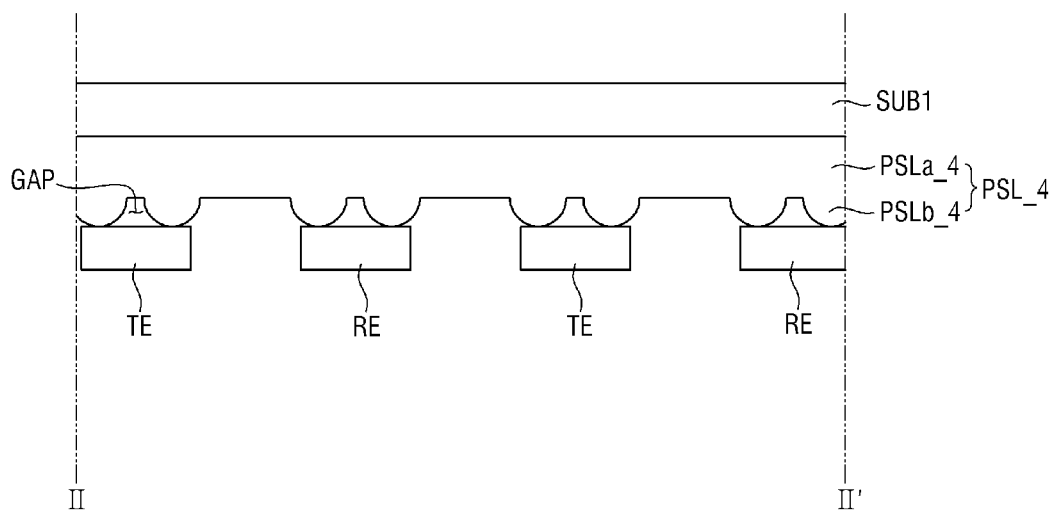
FIG. 17 is a cross-sectional view of a pressure sensor according to some example embodiments.

FIG. 17 is a cross-sectional view of a pressure sensor according to still another embodiment.

Referring to FIG. 17, a first pressure sensor according to the present embodiment is different from the first pressure sensor 510 of FIG. 12 in that a second portion PSLb_4 of a sensor pressure layer PSL_4 is located only in an area where the driving electrode TE and the sensing electrode RE are located, and is not located in an area where the driving electrode TE and the sensing electrode RE are not located.

Other descriptions have been described above with reference to FIG. 12, and a redundant description will be omitted.

Figure 18:
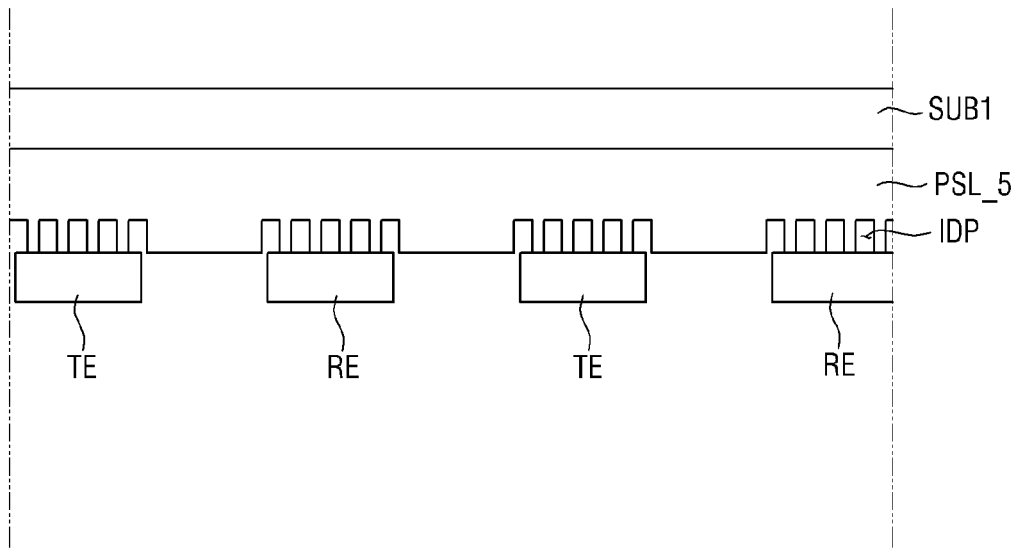
FIG. 18 is a cross-sectional view of a pressure sensor according to some example embodiments.

FIG. 18 is a cross-sectional view of a pressure sensor according to still another embodiment.

Referring to FIG. 18, a first pressure sensor according to the present embodiment is different from the first pressure sensor 510 of FIG. 12 in that the surface of a pressure sensing layer PSL_5 may include an indentation pattern IDP indented from the surface of the pressure sensing layer PSL_5 toward the first substrate SUB1.

For example, the portion where the indentation pattern IDP of the pressure sensing layer PSL_5 is located may constitute a concave portion of the pressure sensing layer PSL_5, and the portion where the indentation pattern IDP of the pressure sensing layer PSL_5 is not located may constitute a convex portion of the pressure sensing layer PSL_5. The concave portion may be indented toward the first substrate SUB1 relative to the convex portion.

The indentation pattern IDP of the pressure sensing layer PSL_5 may be located only in an area where the driving electrode TE and the sensing electrode RE are located, and may not be located in an area where the driving electrode TE and the sensing electrode RE are not located.

The cross-section of the indentation pattern IDP may have a rectangular or square shape as shown in FIG. 18.

Figure 19:
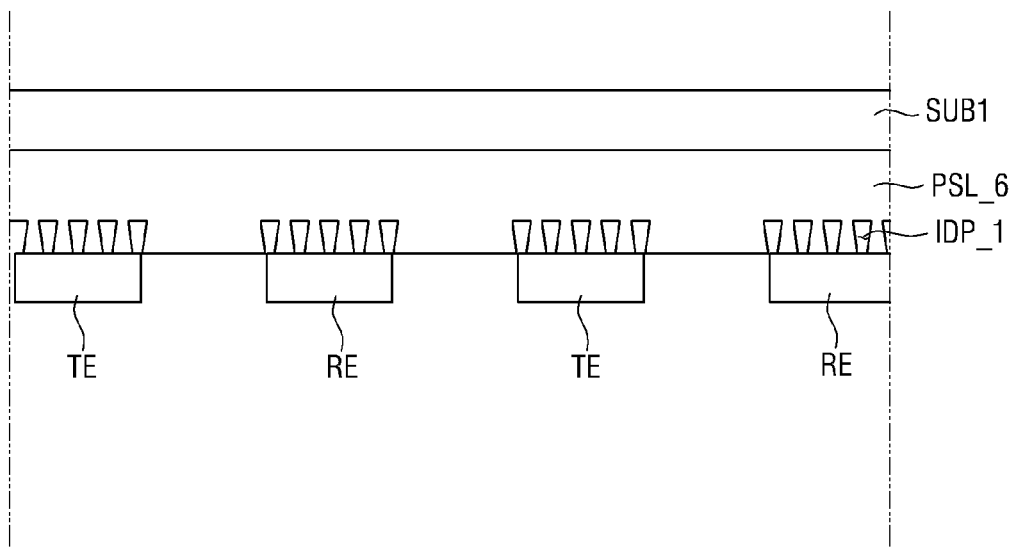
FIG. 19 is a cross-sectional view of a pressure sensor according to some example embodiments.
Figure 20:
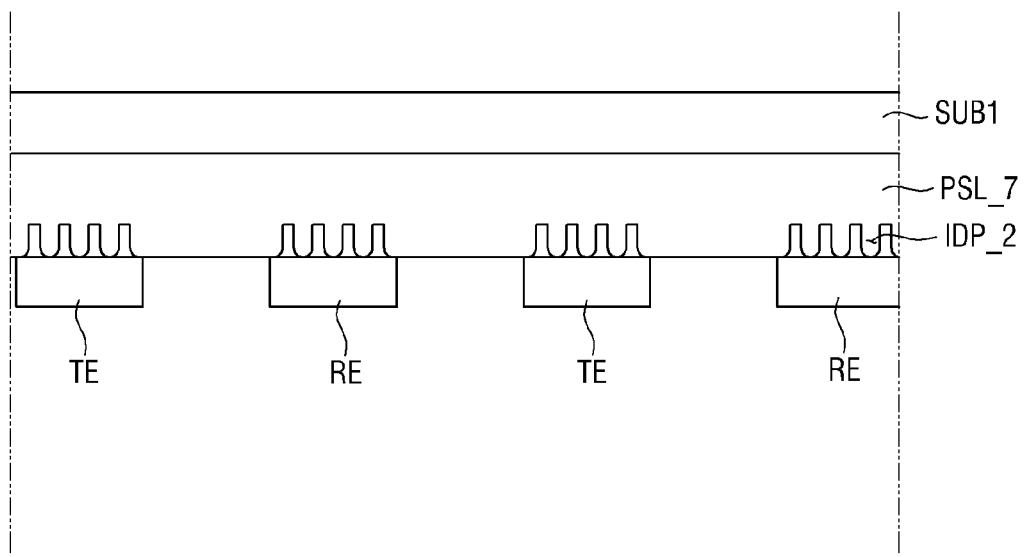
FIG. 20 is a cross-sectional view of a pressure sensor according to some example embodiments.

FIG. 19 is a cross-sectional view of a pressure sensor according to still another embodiment, and FIG. 20 is a cross-sectional view of a pressure sensor according to still another embodiment.

Referring to FIGS. 19 and 20, the first pressure sensors according to these embodiments illustrate that the cross-sectional shape of the indentation pattern IDP of the pressure sensing layer PSL of the first pressure sensor of FIG. 18 may be variously modified.

Referring to FIG. 19, the cross-section of an indentation pattern IDP_1 of a pressure sensing layer PSL_6 may have a trapezoidal shape in which the width thereof increases toward the first substrate SUB1. Referring to FIG. 20, the cross-section of a indentation pattern IDP_2 of a pressure sensing layer PSL_7 may have an elliptic shape or a semi-circular shape.

Figure 21:
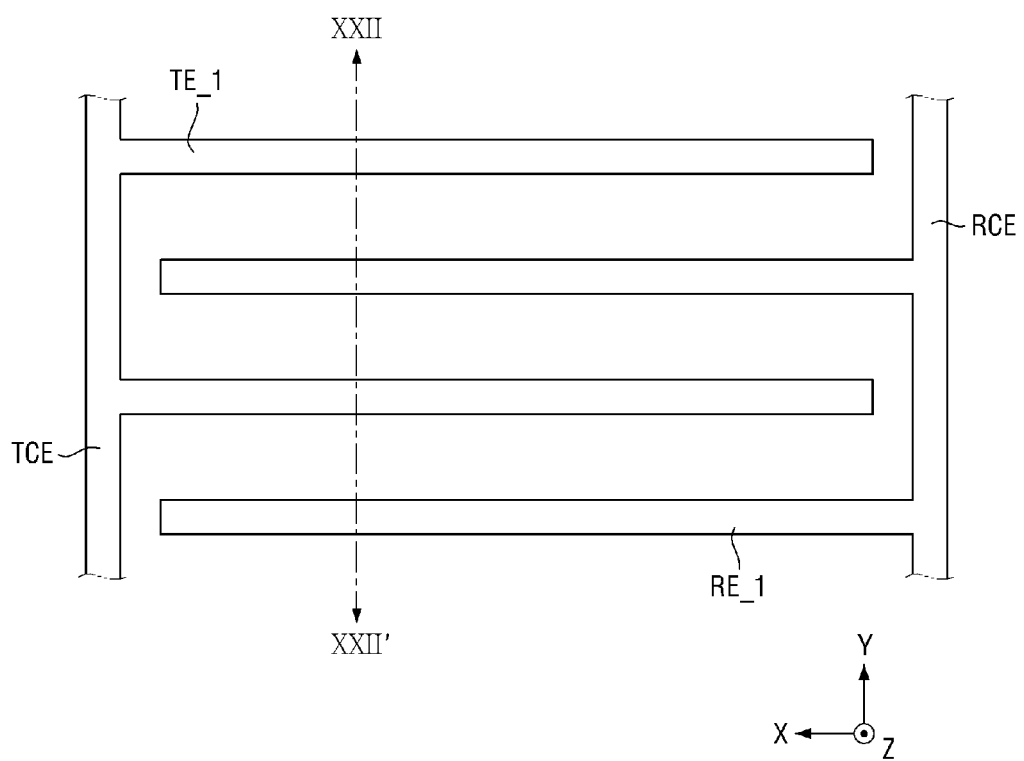
FIG. 21 is an enlarged plan view of a pressure sensor according to some example embodiments.
Figure 22:
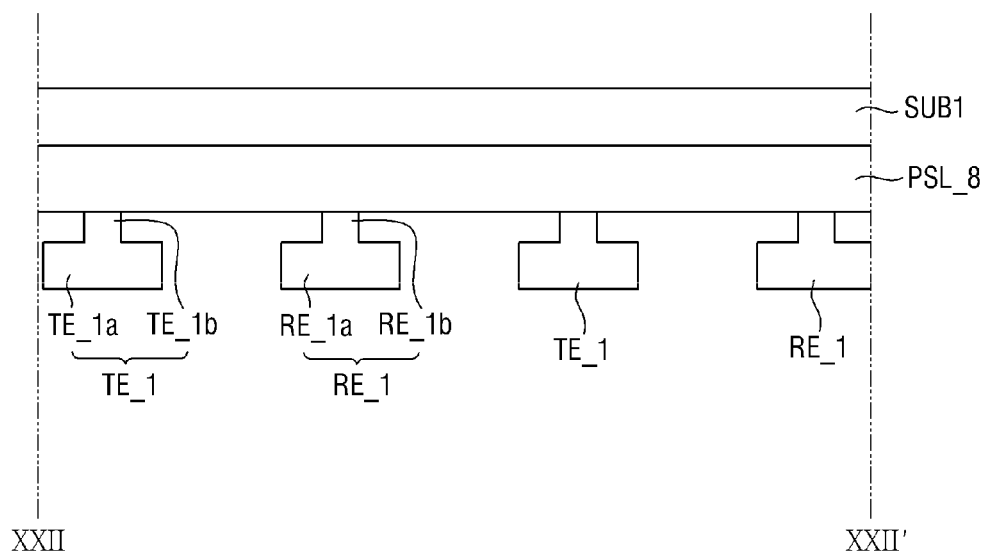
FIG. 22 is a cross-sectional view taken along the line XXII-XXII' of FIG. 21.

FIG. 21 is an enlarged plan view of a pressure sensor according to still another embodiment, and FIG. 22 is a cross-sectional view taken along the line XXII-XXII' of FIG. 21.

Referring to FIGS. 21 and 22, the cross-sectional shapes of a driving electrode TE_1 and a sensing electrode RE_1 of a first pressure sensor according to the present embodiment are different from the cross-sectional shapes of the driving electrode TE and the sensing electrode RE of FIG. 12.

For example, the cross-sectional shapes of the driving electrode TE_1 and the sensing electrode RE_1 according to the present embodiment may include surface irregularities, and the pressure sensing layer PSL_8 may have a generally flat cross-sectional shape without including surface irregularities. The driving electrode TE_1 may includes a first portion TE_1a and a second portion TE_1b connected to the first portion TE_1a, protruding toward the pressure sensing layer PSL_8, and contacting the pressure sensing layer PSL_8. The sensing electrode RE_1 may includes a first portion RE_1a and a second portion RE_1b connected to the first portion RE_1a, protruding toward the pressure sensing layer PSL_8, and contacting the pressure sensing layer PSL_8. The first portion TE_1a of the driving electrode TE_1 may be a first driving electrode portion, and the second portion TE_1b thereof may be a second driving electrode portion. The first portion RE_1a of the sensing electrode RE_1 may be a first sensing electrode portion, and the second portion RE_1b thereof may be a second sensing electrode portion.

Portions where the first portions TE_1a and RE_1a of the driving electrode TE_1 and the sensing electrode RE_1 overlap the second portions TE_1b and RE_1b thereof may be surface convex portions of the driving electrode TE_1 and the sensing electrode RE_1, and portions where the first portions TE_1a and RE_1a of the driving electrode TE_1 and the sensing electrode RE_1 do not overlap the second portions TE_1b and RE_1b thereof and only the first portions TE_1a and RE_1a thereof are located may be surface concave portions of the driving electrode TE_1 and the sensing electrode RE_1.

Other descriptions have been described above with reference to FIG. 12, and a detailed description will be omitted.

Figure 23:
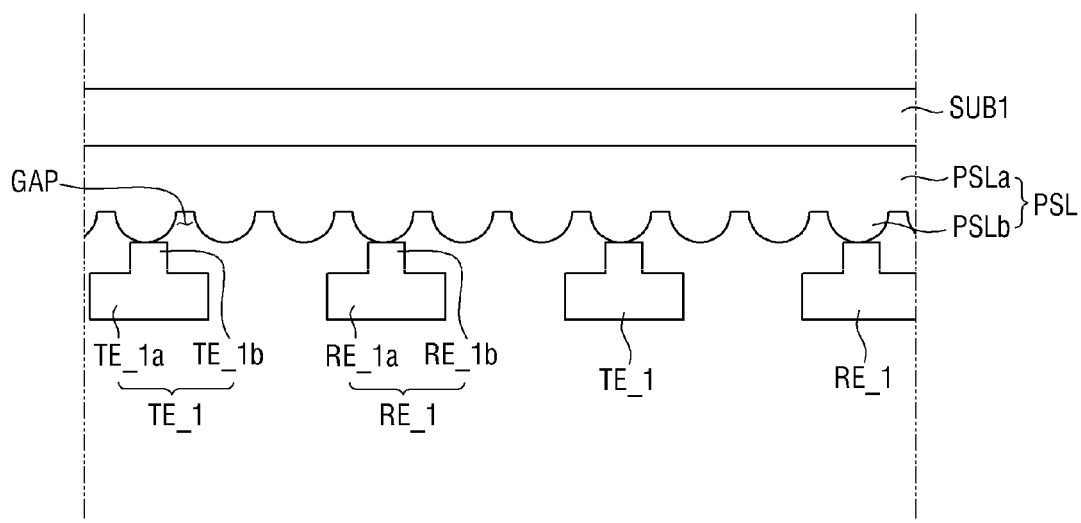
FIG. 23 is a cross-sectional view of a pressure sensor according to some example embodiments.

FIG. 23 is a cross-sectional view of a pressure sensor according to still another embodiment.

Referring to FIG. 23, a first pressure sensor according to the present embodiment is different from the first pressure sensor of FIG. 22 in that the pressure sensing layer PSL of FIG. 12 is located instead of the pressure sensing layer PSL_8 of FIG. 22.

Other descriptions have been described above with reference to FIGS. 12 and 22, and a detailed description will be omitted.

Figure 24:
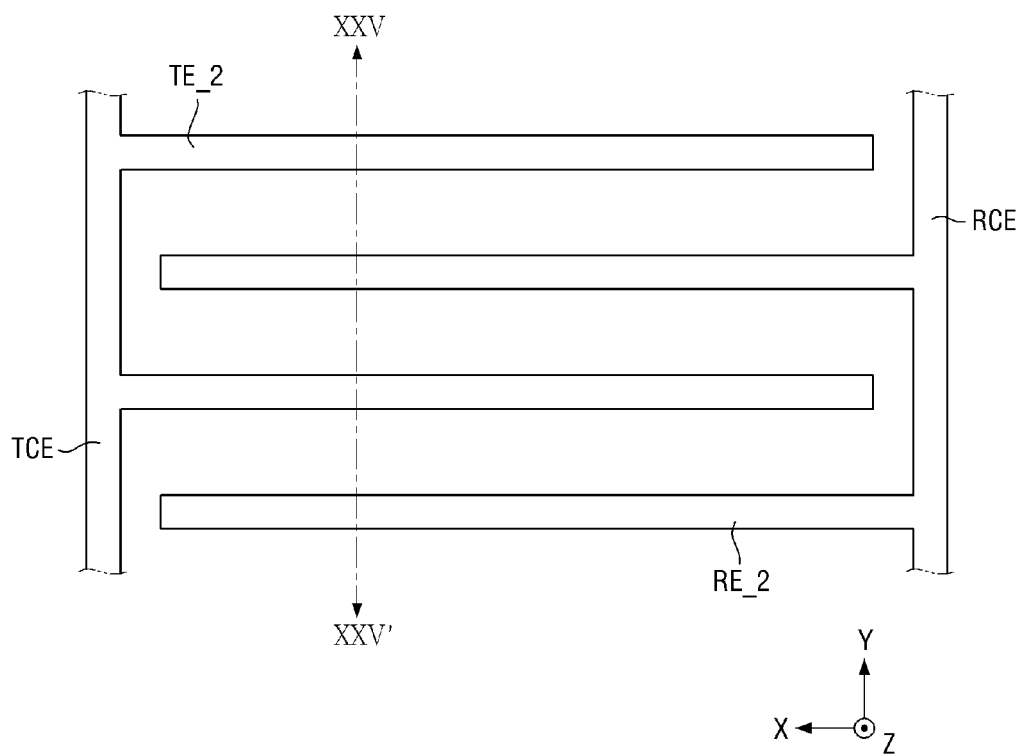
FIG. 24 is an enlarged plan view of a pressure sensor according to some example embodiments.
Figure 25:
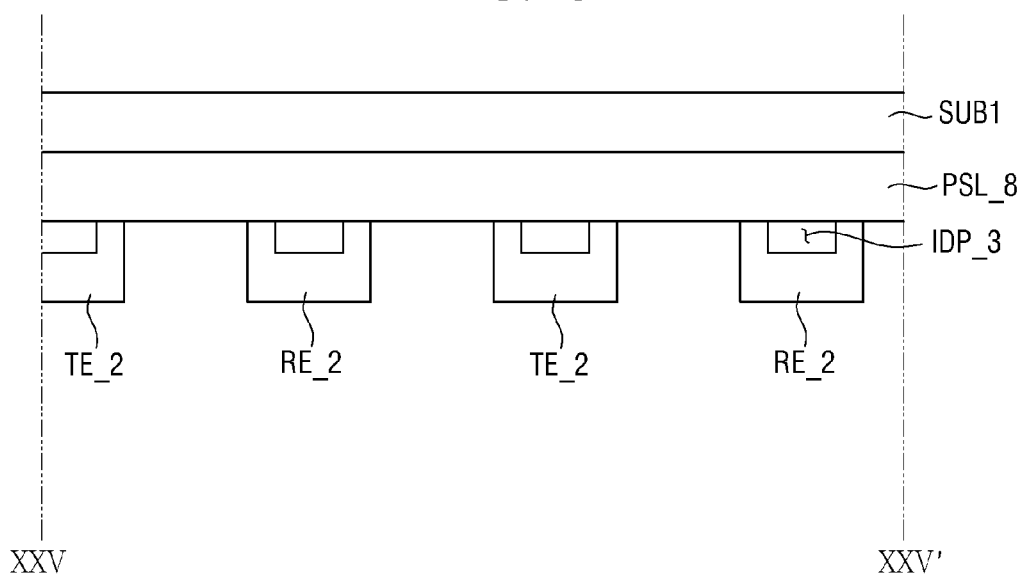
FIG. 25 is a cross-sectional view taken along the line XXV-XXV' of FIG. 24.

FIG. 24 is an enlarged plan view of a pressure sensor according to still another embodiment, and FIG. 25 is a cross-sectional view taken along the line XXV-XXV' of FIG. 24.

Referring to FIGS. 24 and 25, a first pressure sensor according to the present embodiment is different from the first pressure sensor of FIG. 22 in that each of a driving electrode TE_2 and a sensing electrode RE_2 includes an indentation pattern IDP_3 indented in a direction opposite to the direction toward the first substrate SUB1.

For example, each of the driving electrode TE_2 and the sensing electrode RE_2 may include an indentation pattern IDP_3 indented in a direction opposite to the direction from the plane (surface) contacting the pressure sensing layer PSL_8 toward the first substrate SUB1.

The cross-section of the indentation pattern IPD_3 may have a rectangular shape as shown in FIG. 25, but is not limited thereto, and other shapes such as triangle, circle, and ellipse may be applied.

Other descriptions have been described above with reference to FIGS. 12 and 22, and a detailed description will be omitted.

Figure 26:
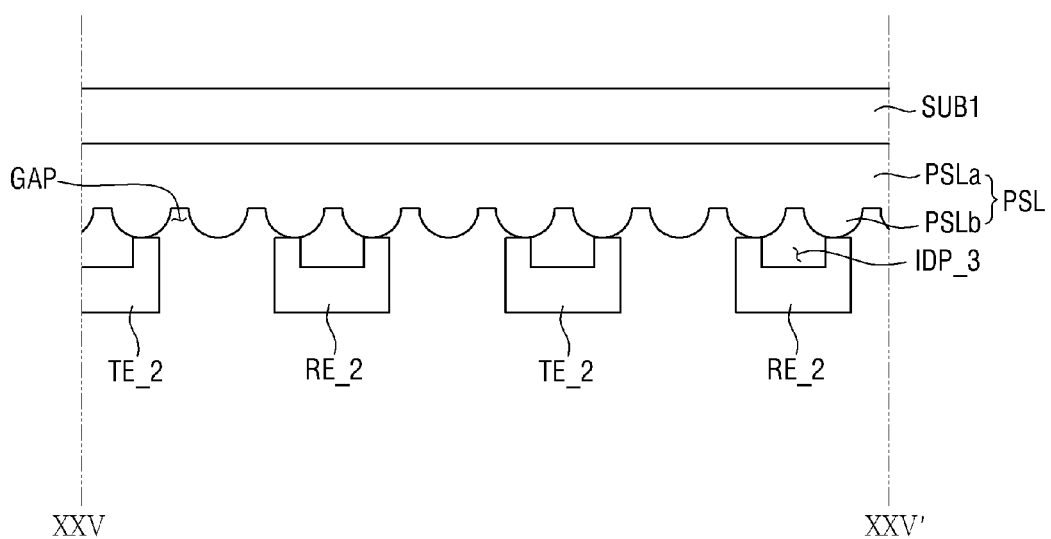
FIG. 26 is a cross-sectional view of a pressure sensor according to some example embodiments.

FIG. 26 is a cross-sectional view of a pressure sensor according to still another embodiment.

Referring to FIG. 26, a first pressure sensor according to the present embodiment is different from the first pressure sensor of FIG. 25 in that the pressure sensing layer PSL of FIG. 12 is applied instead of the pressure sensing layer PSL_8 of FIG. 25.

Other descriptions have been described above with reference to FIGS. 12 and 25, and a detailed description will be omitted.

Figure 27:
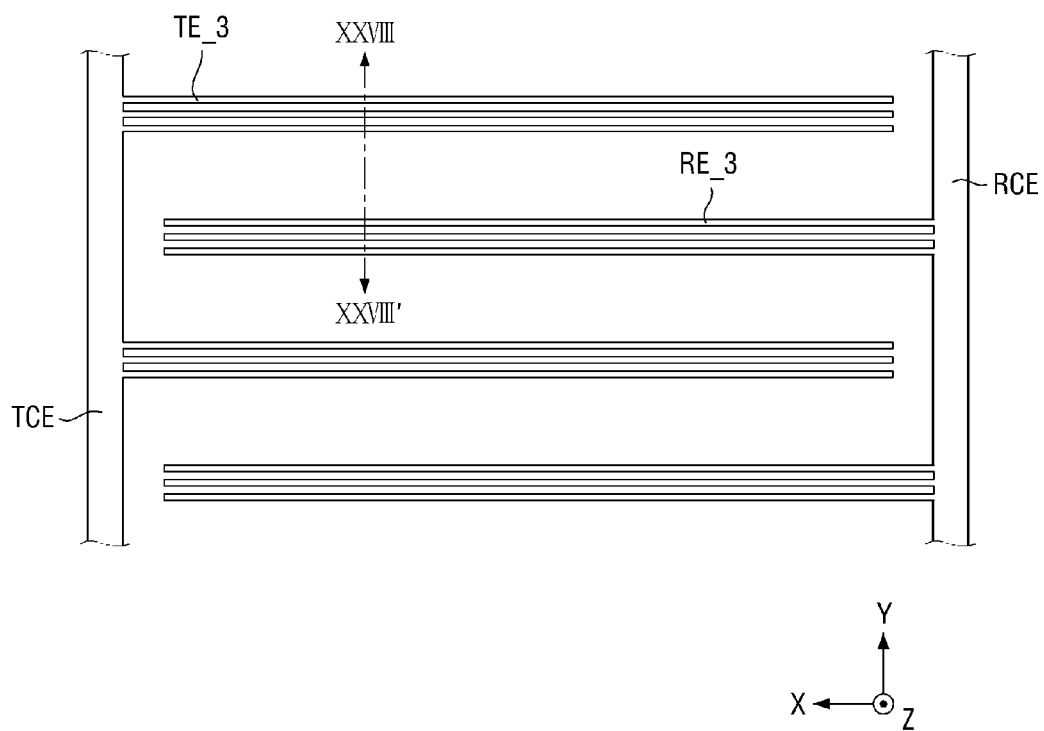
FIG. 27 is an enlarged plan view of a pressure sensor according to some example embodiments.
Figure 28:
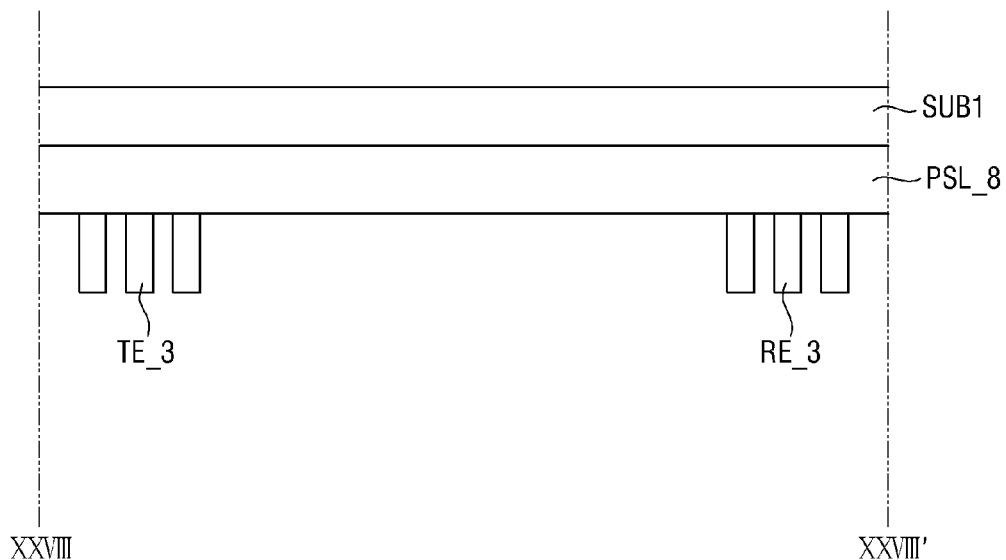
FIG. 28 is a cross-sectional view taken along the line XXVIII-XXVIII' of FIG. 27.

FIG. 27 is an enlarged plan view of a pressure sensor according to still another embodiment, and FIG. 28 is a cross-sectional view taken along the line XXVIII-XXVIII' of FIG. 27.

Referring to FIGS. 27 and 28, a first pressure sensor according to the present embodiment is different from the first pressure sensor of FIGS. 11 and 12 in that each of one driving electrode TE and one sensing electrode RE in FIG. 11 includes a plurality of line-shaped patterns.

For example, each of one driving electrode TE and one sensing electrode RE in FIG. 11 includes a plurality of line-shaped patterns. Although it is shown in the drawings that each of the driving electrode TE_3 and the sensing electrode RE_3 includes three line-shaped patterns, the number of line-shaped patterns is not limited thereto, and the number of line-shaped patterns may be two or four.

Other descriptions have been described above with reference to FIGS. 11 and 12, and a detailed description will be omitted.

Figure 29:
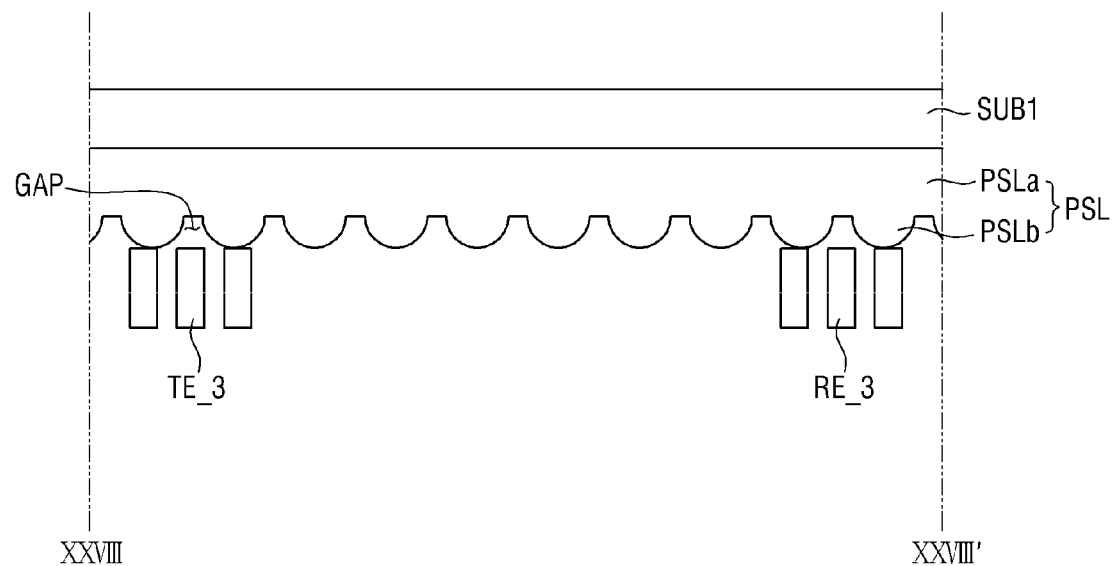
FIG. 29 is a cross-sectional view of a pressure sensor according to some example embodiments.

FIG. 29 is a cross-sectional view of a pressure sensor according to still another embodiment.

Referring to FIG. 29, a first pressure sensor according to the present embodiment is different from the first pressure sensor of FIG. 28 in that the pressure sensing layer PSL of FIG. 12 is located instead of the pressure sensing layer PSL_8 of FIG. 28.

Other descriptions have been described above with reference to FIGS. 12 and 28, and a detailed description will be omitted.

Figure 30:
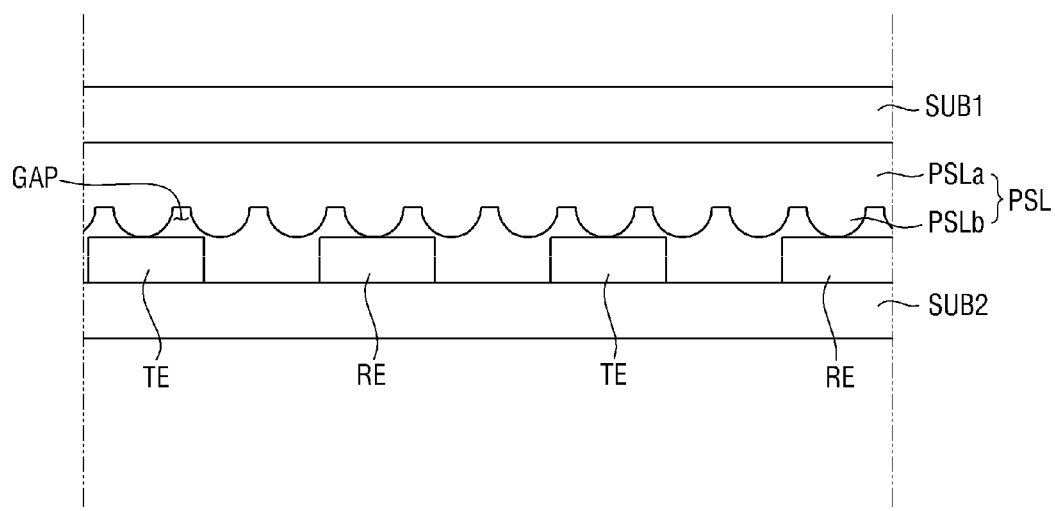
FIG. 30 is a cross-sectional view of a pressure sensor according to some example embodiments.

FIG. 30 is a cross-sectional view of a pressure sensor according to still another embodiment.

Referring to FIG. 30, a first pressure sensor according to the present embodiment is different from the first pressure sensor of FIG. 12 in that the driving electrode TE and the sensing electrode RE are located on one surface of the second substrate SUB2 facing the first substrate SUB1, not one surface of the first substrate SUB1.

For example, the second substrate SUB2 may face the first substrate SUB1. The material of the second substrate SUB2 may be substantially the same as the material of the first substrate SUB1.

The driving electrode TE and the sensing electrode RE may be located on one surface of the second substrate SUB2 facing the first substrate SUB1. Therefore, before pressure is applied to the first pressure sensor, each of the driving electrode TE and the sensing electrode RE may be spaced apart from the pressure sensing layer PSL with s gap therebetween.

According to the pressure sensor and the display device including the same of an embodiment, the pressure sensor can be formed to have a one-layer structure, thereby reducing the overall thickness thereof.

The effects of the present invention are not limited by the foregoing, and other various effects are anticipated herein.

Although the example embodiments of the present invention have been disclosed for illustrative purposes, those skilled in the art will appreciate that various modifications, additions and substitutions are possible, without departing from the scope and spirit of the invention as disclosed in the accompanying claims, and their equivalents.

What is claimed is:

1. A pressure sensor, comprising:
a first substrate;
a pressure sensing layer on one surface of the first substrate; and
a driving electrode and a sensing electrode on the pressure sensing layer and spaced apart from each other,
wherein the driving electrode and the sensing electrode are on a same layer, and
each of the driving electrode and the sensing electrode is directly on the pressure sensing layer, and
wherein the pressure sensing layer includes a polymer resin having metal particles,
wherein a contact area between the pressure sensing layer and the driving electrode and a contact area between the pressure sensing layer and the sensing electrode are increased when a pressure is applied rather than when the pressure is not applied,
wherein the pressure sensing layer includes a first portion on one surface of the first substrate, and a plurality of second portions protruding from the first portion toward the sensing electrode and the driving electrode,
wherein the driving electrode includes a first driving electrode portion, and a second driving electrode protruding from the first driving electrode portion to the pressure sensing layer, and
wherein the second driving electrode overlaps one of the plurality of second portions in a thickness direction of the first substrate, and the second driving electrode does not overlap a dap between adjacent second portions among the plurality of second portions in the thickness direction of the first substrate.

2. The pressure sensor of claim 1, wherein the plurality of second portions are in direct contact with the driving electrode and the sensing electrode.

3. The pressure sensor of claim 2,
wherein the first portion is spaced apart from the driving electrode and the sensing electrode with a space therebetween.

4. The pressure sensor of claim 3,
wherein a first contact area between a second portion from among the second portions and the driving electrode and between the second portion and the sensing electrode before pressure is applied to the pressure sensor is smaller than a second contact area between the second portion and the driving electrode and between the second portion and the sensing electrode after pressure is applied to the pressure sensor.

5. The pressure sensor of claim 2,
wherein a cross-section of a second portion from among the second portions has a semi-circular shape, a semi-elliptic shape, a triangular shape, a trapezoidal shape, or a rectangular shape.

6. The pressure sensor of claim 1,
the sensing electrode includes a first sensing electrode portion, and a second sensing electrode protruding from the first sensing electrode portion to the pressure sensing layer.

7. The pressure sensor of claim 6,
wherein a second driving electrode portion is in direct contact with the pressure sensing layer, and a second sensing electrode portion is in direct contact with the pressure sensing layer.

8. The pressure sensor of claim 1,
wherein each of the driving electrode and the sensing electrode extends along a first direction, and a plurality of driving electrodes comprising the driving electrode and a plurality of sensing electrodes comprising rhe sensing electrode are provided; and
the plurality of the driving electrodes and the plurality of the sensing electrodes are alternately arranged along a second direction crossing the first direction in a plan view, and each of the driving electrode and the sensing electrode includes a plurality of patterns.

9. A pressure sensor, comprising:
a first substrate;
a second substrate facing the first substrate;
a pressure sensing layer on one surface of the first substrate facing the second substrate; and
a driving electrode and a sensing electrode on one surface of the second substrate facing the first substrate and spaced apart from each other,
wherein the driving electrode and the sensing electrode are on a same layer, and the pressure sensing layer includes an uneven structure on a surface facing the driving electrode and the sensing electrode, wherein the pressure sensing layer includes a first portion on one surface of the first substrate, and a plurality of second portions indented from the first portion toward the first substrate, and the plurality of second portions overlap the driving electrode and the sensing electrode in a thickness direction, and do not overlap a space between the driving electrode and the sensing electrode.

10. A display device, comprising:
a display panel; and
a pressure sensor under the display panel,
wherein the pressure sensor includes:
a first substrate;
a pressure sensing layer on one surface of the first substrate; and
a driving electrode and a sensing electrode on the pressure sensing layer and spaced apart from each other,
wherein the driving electrode and the sensing electrode are on a same layer, and
each of the driving electrode and the sensing electrode is directly on the pressure sensing layer, and
wherein the pressure sensing layer includes a polymer resin having metal particles,
wherein a contact area between the pressure sensing layer and the driving electrode and a contact area between the pressure sensing layer and the sensing electrode are increased when a pressure is applied rather than when the pressure is not applied,
wherein the pressure sensing layer includes a first portion on one surface of the first substrate, and a plurality of second portions protruding from the first portion toward the sensing electrode and the driving electrode,
wherein each of the driving electrode and the sensing electrode includes an indentation pattern indented in a direction opposite to the pressure sensing layer, and
wherein the indentation pattern overlaps a gap between adjacent second portions among the plurality of second portions.

11. The display device of claim 10,
wherein each of the driving electrode and the sensing electrode extends along a first direction, and a plurality of driving electrodes comprising the driving electrode and a plurality of sensing electrodes comprising the sensing electrode are provided; and
the plurality of the driving electrodes and the plurality of the sensing electrodes are alternately arranged along a second direction crossing the first direction in a plan view, and each of the driving electrode and the sensing electrode includes a plurality of patterns.

* * * * *